(12) United States Patent
Liu

(10) Patent No.: US 12,499,788 B2
(45) Date of Patent: Dec. 16, 2025

(54) DISPLAY PANEL, SPLICING DISPLAY DEVICE AND METHOD FOR PREPARING THE SAME

(71) Applicant: Hubei Yangtze Industrial Innovation Center Of Advanced Display Co., Ltd., Wuhan (CN)

(72) Inventor: Shaowei Liu, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 395 days.

(21) Appl. No.: 18/119,869

(22) Filed: Mar. 10, 2023

(65) Prior Publication Data

US 2024/0194098 A1 Jun. 13, 2024

(30) Foreign Application Priority Data

Dec. 12, 2022 (CN) .......................... 202211591293.6

(51) Int. Cl.
| | | |
|---|---|---|
| *G09F 9/302* | (2006.01) | |
| *G09F 9/33* | (2006.01) | |
| *H01L 25/075* | (2006.01) | |
| *H10H 20/01* | (2025.01) | |
| *H10H 20/831* | (2025.01) | |
| *H10H 20/857* | (2025.01) | |

(52) U.S. Cl.
CPC ............ *G09F 9/3026* (2013.01); *G09F 9/33* (2013.01); *H01L 25/0753* (2013.01); *H10H 20/01* (2025.01); *H10H 20/831* (2025.01); *H10H 20/857* (2025.01); *H10H 20/032* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 2019/0179591 A1* | 6/2019 | Kuo | H10K 59/18 |
| 2021/0217353 A1* | 7/2021 | Zhao | H01L 25/167 |
| 2022/0052022 A1* | 2/2022 | Yu | H01L 24/33 |

FOREIGN PATENT DOCUMENTS

| | | |
|---|---|---|
| CN | 109920336 A | 6/2019 |
| CN | 113178139 A | 7/2021 |

* cited by examiner

*Primary Examiner* — Nduka E Ojeh
(74) *Attorney, Agent, or Firm* — East IP P.C.

(57) ABSTRACT

The present application provides a display panel, a splicing display device and a method for preparing the same. The display panel includes: a display area, and a non-display area surrounding periphery of the display area. The display panel further includes: a driving chip and a pixel structure. The first display pixel group includes a plurality of first display sub-pixels disposed along a second direction, and the first virtual pixel group includes a plurality of first virtual pixel bits disposed along the second direction, the first direction intersects with the second direction. Within the first repeating unit, an ordering of emissive colors of the plurality of first display sub-pixels along the second direction is in reverse to a preset ordering of emissive colors of the plurality of first virtual pixel bits along the second direction.

20 Claims, 15 Drawing Sheets

S101

DISPLAY PANEL, SPLICING DISPLAY DEVICE AND METHOD FOR PREPARING THE SAME

CROSS-REFERENCE TO RELATED APPLICATION

The present application is based upon and claims priority to Chinese Patent Application No. 202211591293.6, filed on Dec. 12, 2022, which is incorporated herein by reference in its entirety.

TECHNICAL FIELD

The present application relates to the technical field of display devices, in particular to a display panel, a splicing display device and a method for preparing the same.

BACKGROUND

With continuous development of digital technologies, display devices have been widely used in various aspects of daily life. Nowadays, display device industry is being developed towards mass production or large-size device production. In order to make a display device have a larger size, a splicing display device came into being.

The splicing display device is a display device having a larger size which is formed by splicing several smaller display panels in a certain arrangement. Due to limitations of internal structures of the display panels, there may exist different levels of display problems at joints of adjacent display panels.

SUMMARY

Embodiments of the present application provide a display panel, a splicing display device and a method for preparing the same, which can increase a screen-to-body ratio.

In a first aspect, the embodiments of the present application provide a display panel, including: a display area, and a non-display area surrounding periphery of the display area. The display panel further includes and a driving chip and a pixel structure. The driving chip is located in the non-display area at one side of the display area in a first direction. The pixel structure includes a plurality of first repeating units which are located in the display area. The first repeating unit includes a first display pixel group and a first reserved pixel group which are disposed side by side along the first direction, wherein the first display pixel group includes a plurality of first display sub-pixels disposed along a second direction, and the first reserved pixel group includes a plurality of first reserved pixel bits disposed along the second direction, the first direction intersects with the second direction. Within the first repeating unit, an ordering of emissive colors of the plurality of first display sub-pixels along the second direction is in reverse to a preset ordering of emissive colors of the plurality of first reserved pixel bits along the second direction.

In a second aspect, the embodiments of the present application provide a splicing display device, including: a first sub-screen and a second sub-screen that are spliced with each other along a first direction, each of the first sub-screen and the second sub-screen includes the display panel according to any one of previous embodiments. Within the first sub-screen, the driving chip is located at one side of the pixel structure away from the second sub-screen; and within the second sub-screen, the driving chip is located at one side of the pixel structure away from the first sub-screen. Within the first repeating unit of one of the first sub-screen and the second sub-screen, the first display pixel group is located at one side of the first reserved pixel group away from the driving chip, and within the first repeating unit of the other of the first sub-screen and the second sub-screen, the first display pixel group is located at one side of the first reserved pixel group near the driving chip.

In a third aspect, the embodiments of the present application provide a method for preparing a splicing display device, including: providing a plurality of array substrates, the array substrate comprising a driving chip and an electrode arrangement structure which are spaced in a first direction, the electrode arrangement structure comprises a plurality of electrode repeating units, and the electrode repeating unit comprises a first electrode group and a second electrode group which are disposed side by side in the first direction, wherein the first electrode group comprises a plurality of first electrode units which are disposed side by side along a second direction, and the second electrode group comprises a plurality of second electrode units which are disposed side by side along the second direction and electrically connected with the first electrode units, the first direction intersects with the second direction; transferring light-emitting chips of multiple colors to one of the array substrates and electrically connecting the light-emitting chips with the first electrode units to form first sub-screens; transferring light-emitting chips of multiple colors to another one of the array substrates and electrically connecting the light-emitting chips with the second electrode units to form second sub-screens, wherein an ordering of emissive colors of the light-emitting chips along the second direction in the first sub-screen is in reverse to an ordering of emissive colors of the light-emitting chips along the second direction in the second sub-screen; and splicing the first sub-screens and the second sub-screens along the first direction, wherein within the first sub-screen, the driving chip is located at one side of the electrode arrangement structure away from the second sub-screen, and within the second sub-screen, the driving chip is located at one side of the electrode arrangement structure away from the first sub-screen.

BRIEF DESCRIPTION OF THE DRAWINGS

In order to more clearly explain technical solutions of the embodiments of the present application, drawings required for the embodiments of the present application will be briefly introduced. For those skilled in the art, other drawings can also be obtained from these drawings without inventive efforts.

DESCRIPTIONS OF REFERENCE SIGNS

Figure 1:
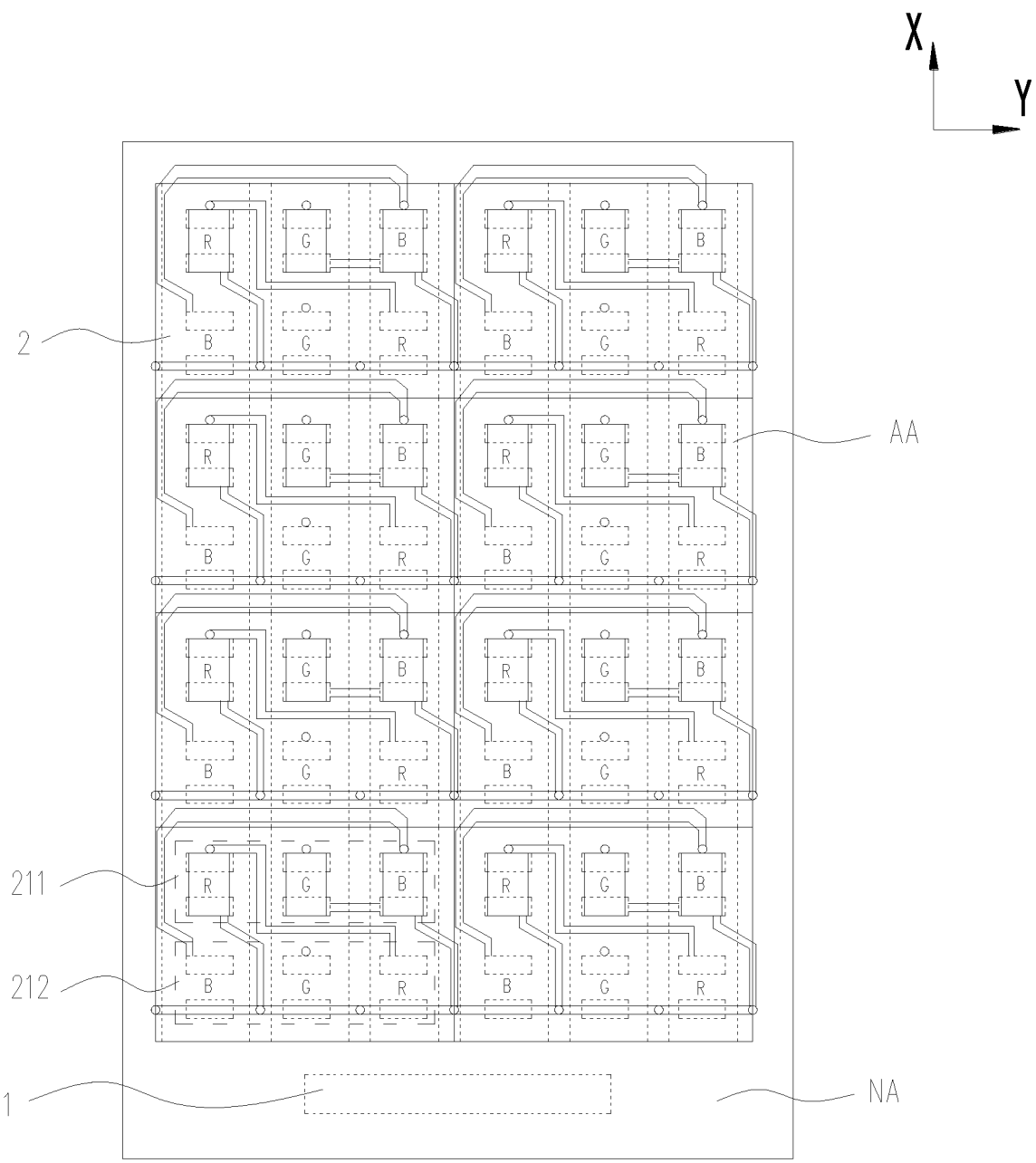
FIG. 1 is a structural diagram of a display panel according to an embodiment of the present application.

1, Driving chip;
2, Pixel structure; 21, First repeating unit; 211, First display pixel group; 2111, First display sub-pixel; 2112, First electrode; 2113, Second electrode; 212, First reserved pixel group; 2121, First reserved pixel bit; 2122, Third electrode; 2123, Fourth electrode; 22, Second repeating unit; 221, Second display pixel group; 2211, Second display sub-pixel; 2212, Fifth electrode; 2213, Sixth electrode; 222, Second reserved pixel group; 2221, Second reserved pixel bit;
3, First signal line;
4, Second signal line;
5, Electrode connection line; 51, First part; 52, Second part;
61, First via; 62, First signal connection line;
71, Second via; 72, Second signal connection line;
2', Electrode arrangement structure; 21', Electrode repeating unit; 211', First electrode group; 2111', First electrode unit; 212', Second electrode group; 2121', Second electrode unit;
P1, First sub-screen; P2, Second sub-screen; PX, Light-emitting chip;
AA, Display area; NA, Non-display area;
X, First direction; Y, Second direction; Z, Thickness direction.

DETAILED DESCRIPTION

Features and exemplary embodiments of respective aspects of the present application will be described in detail below. In order to make the purposes, technical schemes and advantages of the present application more clear, the present application will be further described in detail below in combination with the attached drawings and specific embodiments. It should be understood that the specific embodiments described herein are only intended to explain the present application, not to limit the present application. For those skilled in the art, the present application can be implemented without some of these specific details. The following description of the embodiments is only to provide a better understanding of the present application by showing examples of the present application.

It should be noted that in this document, relational terms such as the "first" and "second" are only used to distinguish one entity or operation from another entity or operation, and do not necessarily require or imply any such actual relationship or order between these entities or operations. Moreover, terms "including", "comprising" or any other variation thereof are intended to cover non-exclusive inclusion, so that a process, method, article or equipment that includes a series of elements not only includes those elements, but also includes other elements that are not explicitly listed, or also includes elements inherent in such process, method, article or equipment. With absence of further restrictions, an element defined by a statement "including" do not exclude existence of other elements in a process, method, article or equipment including the element.

In splicing display technologies, a plurality of display panels are need to be prepared firstly, and then the plurality of display panels are spliced together to form a splicing display device with a larger size. For a single display panel, it usually includes a display area and a non-display area surrounding periphery of the display area. The display panel includes a plurality of pixel areas configured for achieving display effects in the display area, and a driving chip configured to control the pixel areas to start light-emitting or stop light-emitting through a driving circuit in the non-display area.

The driving chip is usually located at one side of the display area and occupies a large space. Therefore, a distance between one side of the display area close to the driving chip and a corresponding edge of the display panel is often greater than a distance between the other side of the display area away from the driving chip and another corresponding edge of the display panel. When two display panels are spliced, if locations of the driving chips of the two display panels with respect to respective display areas are the same, one driving chip would be located between the display area of its corresponding display panel and a joint, that is, there would be a large space between the display areas of the two display panels in which display cannot be achieved, thus affecting display effects.

If one of the display panels is rotated 180 degrees, that is, the two display panels are spliced at their sides away from respective driving chips to form a display device, it can avoid the problem that there is a large space between the display areas of the two display panels in which display effects cannot be achieved. However, existing display panels that are used to form a splicing display device usually have the same structures, that is, arrangements of sub-pixels of different colors in respective pixel areas of the display panels are consistent with each other, so rotating one of the display panels will lead to an opposite arrangement of sub-pixels to the other display panel, resulting in display color mismatch.

If, on this basis, the pixel arrangement of one of the display panels is adjusted so that the pixel arrangement after rotation of 180 degrees is the same as that of the other display panel, this will avoid color mismatch in a resulted splicing display device. However, it requires adjustment of a connection mode of the driving circuit or a control mode of the driving chip in the display panel during process of preparing the display panel, which will greatly increase difficulty in preparation of the display panel and lead to a longer preparation cycle.

To solve the above problems, please refer to FIGS. 1 to 5 for a first aspect, the embodiments of the present application provide a display panel including a display area AA and a non-display area NA surrounding periphery of the display area AA. The display panel includes a driving chip 1 and a pixel structure 2. The driving chip 1 is located in the non-display area NA at one side of the display area AA in a first direction X.

The pixel structure 2 includes a plurality of first repeating units 21 located in the display area AA, and the first repeating unit 21 includes a first display pixel group 211 and a first reserved pixel group 212 which are arranged side by side along the first direction X. The first display pixel group 211 includes a plurality of first display sub-pixels 2111 arranged along a second direction Y, and the first reserved pixel group 212 includes a plurality of first reserved pixel bits 2121 arranged along the second direction Y, wherein the first direction X intersects the second direction Y.

Within the first repeating unit 21, an ordering of emissive colors of the first display sub-pixels 2111 along the second direction Y is in reverse to an ordering of a preset ordering of emissive colors of the first reserved pixel bits 2121 along the second direction Y.

The display panel includes the display area AA and the non-display area NA, and the pixel structure 2 is disposed in the display area AA to achieve display effects. The driving chip 1 is located in the non-display area NA and at one side of the display area AA in the first direction X. The shape and size of the display panel is not limited in the present application. For example, the display panel may be a rectangular structure, and its long side may be parallel to the first direction X.

The first repeating unit 21 is located in the display area AA. The first repeating unit 21 includes a plurality of sub-pixels with different colors. The plurality of sub-pixels constitute the first repeating unit 21. The first repeating unit 21 is translated and repeated to form the pixel structure 2. Specifically, the single display panel includes a plurality of first repeating units 21 having the same structures. The plurality of first repeating units 21 are arrayed in an array along the first direction X and the second direction Y to form the pixel structure 2. For example, the first direction X intersects with the second direction Y. In the case where the display panel is a rectangular structure, its short side may be parallel to the second direction Y.

It should be noted that the pixel structure 2 may include only the first repeating units 21 disposed in an array, and may further include other repeating units, which is not limited in the embodiments of the present application.

The first repeating unit 21 includes the first display pixel group 211 and the first reserved pixel group 212 which are arranged side by side in the first direction X. The first display pixel group 211 is provided to achieve display effects, while the first reserved pixel group 212 is not provide to achieve display effects. Within a single first repeating unit 21, the first display pixel group 211 may be located at one side of the first reserved pixel group 212 near the driving chip 1, or the other side of the first reserved pixel group 212 away from the driving chip 1. For different display panels, location of the first display pixel group 211 with respect to the first reserved pixel group 212 within the first repeating units 21 may be varying or may be the same.

The first display pixel group 211 includes a plurality of first display sub-pixels 2111 disposed along the second direction Y. The first display sub-pixel 2111 is the smallest light-emitting unit used to realize display effects in the display panel. The first display pixel group 211 include the plurality of first display sub-pixels 2111 with different colors, including but not limited to red, blue, green, etc. For example, the first display pixel group 211 may include a plurality of electrode positions, and during preparation of the display panel, light-emitting chips for different colors can be transferred to the respective electrode positions in the first display pixel group 211, thus forming the plurality of first display sub-pixels 2111.

The first reserved pixel group 212 includes the plurality of first reserved pixel bits 2121 disposed along the second direction Y. The first reserved pixel bit 2121 is not provided with a light-emitting chip, so the first reserved pixel bit 2121 will not realize display effects. For example, the plurality of first reserved pixel bits 2121 may include a plurality of electrode positions, which are configured to drive different colors of light-emitting chips to emit light. Therefore, the "preset emissive colors" mentioned in the embodiments of the present application refers to colors of the light-emitting chips corresponding to the first reserved pixel bits 2121.

Within a single first repeating unit 21, the number of the first display sub-pixels 2111 is the same as the number of the first reserved pixel bits 2121, and emissive colors of the first display sub-pixels 2111 are the same as preset emissive colors of the first reserved pixel bits 2121. During preparation of the display panel, if light-emitting chips transferred to some of the first display sub-pixels 2111 have problems, light-emitting chips with the same colors can be transferred to corresponding first reserved pixel bits 2121, so as to ensure that the number and types of light-emitting chips that are used for achieving light-emitting effects in respective first repeating units 21 remain the same, and thus improve display uniformity.

Within the first repeating unit 21, the ordering of emissive colors of the first display sub-pixels 2111 along the second direction Y is in reverse to the preset ordering of emissive colors of the first reserved pixel bits 2121 along the second direction Y. The ordering mentioned here refers to a specific direction along the second direction Y. Specifically, taking the second direction Y being an extension direction from left to right in FIG. 2 as an example, the ordering of emissive colors mentioned in the embodiments of the present application refers to that the ordering of emissive colors of the first display sub-pixels 2111 along the direction from left to right is in reverse to the preset ordering of emissive colors of the first reserved pixel bits 2121 along the direction from left to right.

For a splicing display device, the display panel provided by the embodiments of the present application enables reduction of an influence of the driving chip 1 on display effects and reduction of difficulty in design of the display panel. Specifically, taking FIG. 5 as an example, the splicing display device includes two display panels, the upper one and lower one, which may be the display panels shown in FIG. 1 and FIG. 3 respectively. In the splicing display device, each of two driving chips 1 in the two display panels is located at one side of its corresponding display panel that is far away from a splicing joint, so there is a smaller distance between display areas AA of the two display panels, which can reduce risks of occurrence of a non-display area AA that is visible by human eyes at the center of the splicing display device and reduce an influence of the driving chip 1 on display effects.

In the upper display panel, the first display pixel group 211 is located at a side of the first reserved pixel group 212 near the driving chip 1; and in the lower display panel, the first display pixel group 211 is located at a side of the first reserved pixel group 212 away from the driving chip 1. The two display panels have the same structure, such as arrangement of their driving circuits, except for the location of the first display pixel group 211 with respect to the first reserved pixel group 212. Therefore, although the structures of the upper and lower display panels are slightly different, preparation of the upper and lower display panels may have the same processes, except for transferring processes for light-emitting chips, and even may be implemented through a single process.

During transferring of light-emitting chips, for the upper display panel, a light-emitting chip needs to be transferred to a side of the first repeating unit 21 near the driving chip 1 to form the first display pixel group 211, while the other side away from the driving chip 1 does not have a light-emitting chip, so as to form the first reserved pixel group 212. For the lower display panel, a light-emitting chip needs to be transferred to a side of the first repeating unit 21 way from the driving chip 1 to form the first display pixel group 211, while the other side near the driving chip 1 does not have a light-emitting chip, so as to form the first reserved pixel group.

Figure 5:
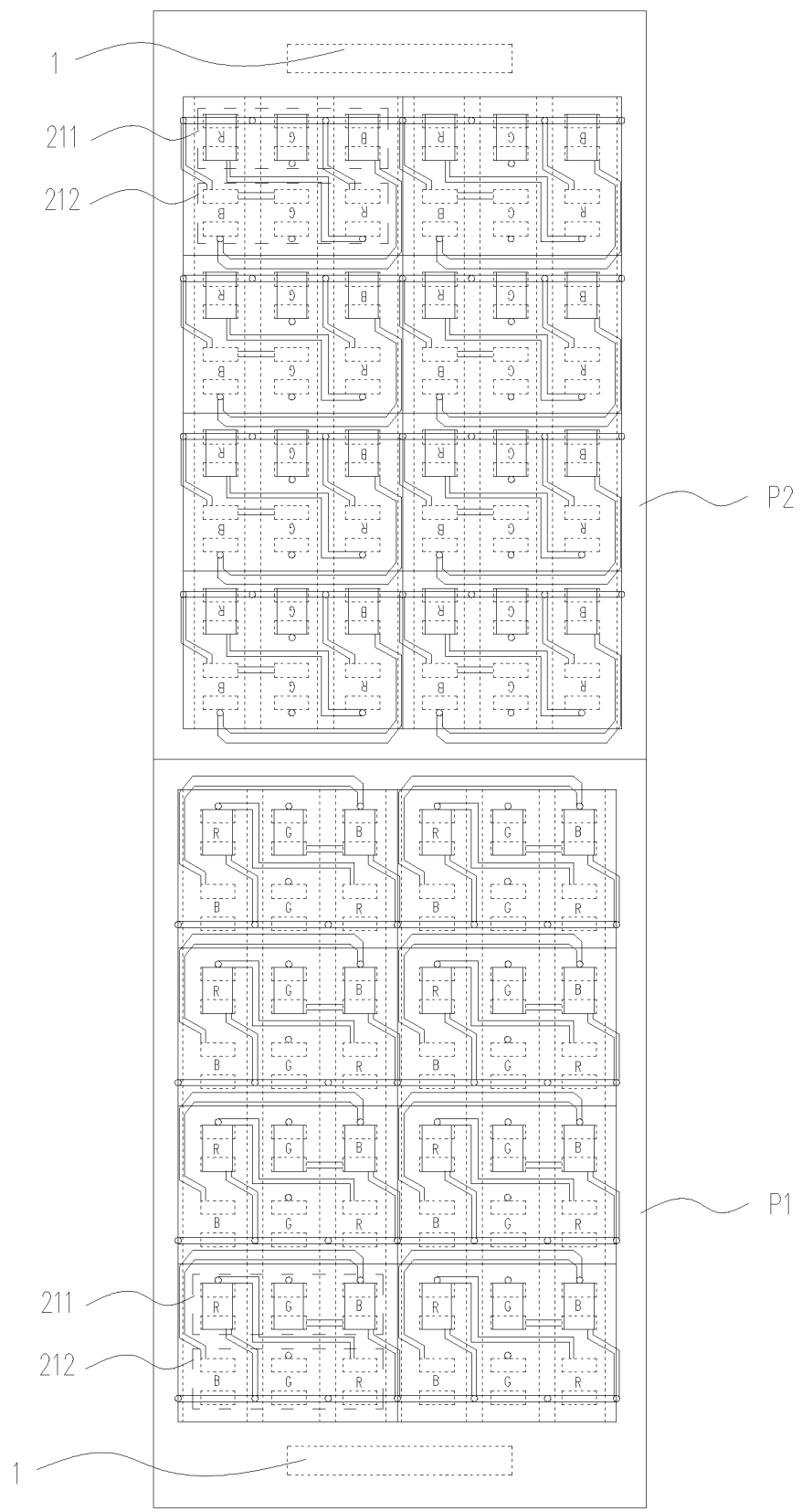
FIG. 5 is a structural diagram of a splicing display device according to an embodiment of the present application.
Figure 6:
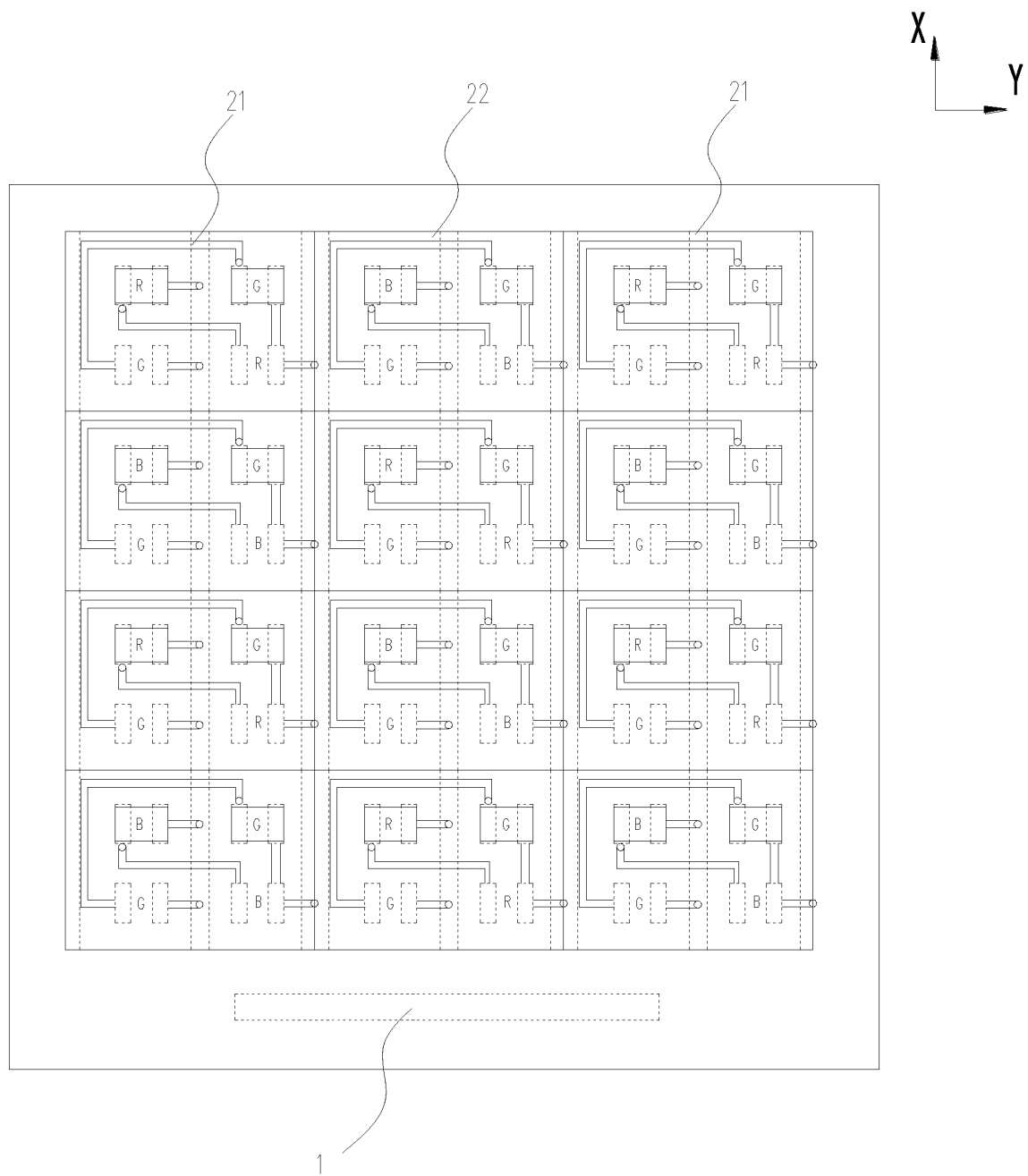
FIG. 6 is a structural diagram of another display panel according to an embodiment of the present application.

In addition, within the first repeating unit 21 according to the embodiments of the present application, the ordering of emissive colors of the first display sub-pixels 2111 is in reverse to the preset ordering of emissive colors of the first reserved pixel bits 2121, so it can be seen from FIG. 5 that the two display panels have the same ordering of emissive colors of the first display sub-pixels 2111 after splicing due to 180 degree rotation of one of the display panels. Thus, the splicing display device will not have the problem of display color mismatch, which can further improve display effects of the splicing display device.

To sum up, the display panel provided by the embodiments of the present application is applicable to a splicing display device, which can avoid risks of occurrence of display color mismatch or occurrence of a non-display area that is visible by human eyes at a splicing joint of the splicing display device by merely changing transferred positions of light-emitting chips of the display panel without changing a disposition of a driving circuit within the display panel. Display effects of the splicing display device can thus be improved and difficulty in preparation can be reduced.

In addition, according to the display panel provided by the embodiments of the present application, when a transferred light-emitting chip has a problem, a light-emitting chip with the same color can be transferred to a corresponding first reserved pixel bit 2121, such that it can achieve display effects, which improves a quality rate of the display panel. It should be noted that in general, there is a smaller probability of transferring a light-emitting chips to a first reserved pixel bit 2121, and even if it is necessary to transfer some light-emitting chips to the first reserved pixel bits 2121 in the display panel, the number of these light-emitting chips is usually small, so it will not cause the display panel or the splicing display device to have display color mismatch.

In some embodiments, referring to FIGS. 6 to 9, the pixel structure 2 may further include a plurality of second repeating units 22. The first repeating units 21 and the second repeating units 22 are alternately disposed in the first direction X and in the second direction Y. The second repeating unit 22 includes a second display pixel group 221 and a second reserved pixel group 222 which are disposed along the first direction X. The second display pixel group 221 includes a plurality of second display sub-pixels 2211 which are disposed along the second direction Y, and the second reserved pixel group 222 includes a plurality of second reserved pixel bits 2221 which are disposed along the second direction Y. Within the second repeating unit 22, an ordering of emissive colors of the plurality of second display sub-pixels 2211 along the second direction Y is in reverse to a preset ordering of emissive colors of the plurality of second reserved pixel bits 2221 along the second direction Y. At least a part of the second display sub-pixels 2211 has different emissive colors from any of the first display sub-pixels 2111.

The pixel structure 2 includes not only the first repeating units 21 but also the second repeating units 22. The first repeating units 21 and the second repeating units 22 are alternately disposed in the first direction X and in the second direction Y. Specifically, a second repeating unit 22 is disposed between two adjacent first repeating units 21 either in the first direction X or in the second direction Y, and similarly, a first repeating unit 21 is disposed between two adjacent second repeating units 22 either in the first direction X or in the second direction Y.

Similarly with the first repeating unit 21, the second repeating unit 22 includes the second display pixel group 221 and the second reserved pixel group 222 which are disposed along the first direction X. The second display pixel group 221 includes the plurality of second display sub-pixels 2211 with multiple colors, including but not limited to red, blue, green, and white etc. The second repeating unit 22 substantively has the same structure as the first repeating unit 2. The structure of the second repeating unit 22 that are the same as that of the first repeating unit 21 will not be repeated in the embodiment of the present application.

However, unlike the first repeating unit 21, at least a part of the second display sub-pixels 2211 has different emissive colors from any of the first display sub-pixels 2111. For example, the first repeating unit 21 includes the first display sub-pixels 2111 in red and green, while the second repeating unit 22 includes the second display sub-pixels 2211 in blue and white.

Within the second repeating unit 22, the ordering of emissive colors of the plurality of second display sub-pixels 2211 along the second direction Y is in reverse to a preset ordering of emissive colors of the plurality of second reserved pixel bits 2221 along the second direction Y. The "ordering of emissive colors" mentioned here has the same meaning as that in the previous embodiments and will not be repeated in the embodiment of the present application.

In addition, since the second repeating unit 22 includes the second display pixel group 221 and the second reserved pixel group 222, it can avoid risks of occurrence of display color mismatch or occurrence of a non-display area that is visible by human eyes at a splicing joint of a splicing display device by merely changing transferred positions of light-emitting chips in the second repeating unit 22 of the display panel without changing a disposition of a driving circuit within the display panel.

In the embodiment of the present application, the pixel structure 2 includes not only the first repeating units 21 but also the second repeating units 22, which can indirectly reduce the number of the first display sub-pixels 2111 of the first repeating unit 21, thus reducing difficulty in design of wirings in the first repeating unit 21. Specifically, both the first display sub-pixels 2111 and the first reserved pixel bits 2121 in the first repeating unit 21 are provided with electrode positions for connecting driving chips 1 and the ordering of emissive colors of the first display sub-pixels 2111 is in reverse to the ordering of emissive colors of the first reserved pixel bits 2121, so a part of wirings in the first repeating unit 21 needs to be connected through vias or disposed to avoid other wirings in a same layer. If there is a large number of the first display sub-pixels 2111 in the first repeating unit 21, difficulty in design of wirings in the first repeating unit 21 would increase. Therefore, setting of the second repeating units 22 can reduce difficulty in design of wirings in the first repeating unit 21.

It should be noted that the pixel structure 2 may include other repeating units in addition to the first repeating units 21 and the second repeating units 22, which is not limited in the embodiment of the present application.

In some embodiments, at least a part of the second display sub-pixels 2211 has the same emissive colors as at least a part of the first display sub-pixels 2111. By setting that at least a part of the second display sub-pixels 2211 and at least a part of the first display sub-pixels 2111 have the same colors, the first display sub-pixels 2111 and the second display sub-pixels 2211 which have the same colors can be prepared in a same process, and thus preparation of the display panel can be simplified.

Optionally, the first repeating unit 21 and the second repeating unit 22 include a first display sub-pixel 2111 and a second display sub-pixel 2211 in green, respectively. The human eyes are usually sensitive to a green color, so a part of the first display sub-pixels 2111 and a part of the second display sub-pixels 2211 are set to green, such that the number of green light-emitting units is greater than the number of other colors, so as to ensure that displayed green color will not be distorted, and thus to improve comfort of human eyes when watching.

In some embodiments, as shown in FIGS. 6 to 9, the first display sub-pixel 2111 includes a first electrode 2112 and a second electrode 2113, and the second display sub-pixel 2211 includes a fifth electrode 2212 and a sixth electrode 2213. An arrangement direction of the first electrode 2112 and the second electrode 2113 is parallel to an arrangement direction of the fifth electrode 2212 and the sixth electrode 2213.

The electrode position corresponding to each of the first display sub-pixels 2111 includes the first electrode 2112 and the second electrode 2113, which are positive electrode and negative electrode, respectively. The electrode position corresponding to each of the second display sub-pixels 2211 include the fifth electrode 2212 and the sixth electrode 2213, which are positive electrode and negative electrode, respectively.

In the embodiment of the present application, the arrangement direction of the first electrode 2112 and the second electrode 2113 is parallel to the arrangement direction of the fifth electrode 2212 and the sixth electrode 2213, so difficulty in preparation of the display panel can be further simplified. Specifically, the first electrode 2112 and the second electrode 2113 in the first display sub-pixel 2111 need to be connected to corresponding signal lines through wirings, and the fifth electrode 2212 and the sixth electrode 2213 in the second display sub-pixel 2211 also need to be connected to corresponding signal lines through wirings. Therefore, by setting the arrangement direction of the first electrode 2112 and the second electrode 2113 in the first display sub-pixel 2111 to be parallel to the arrangement direction of the fifth electrode 2212 and the sixth electrode 2213 in the second display sub-pixel 2211, arrangement of wirings in the first repeating unit 21 and in the second repeating unit 22 can be set to be consistent, which can further reduce difficulty in preparation of the display panel.

Figure 7:
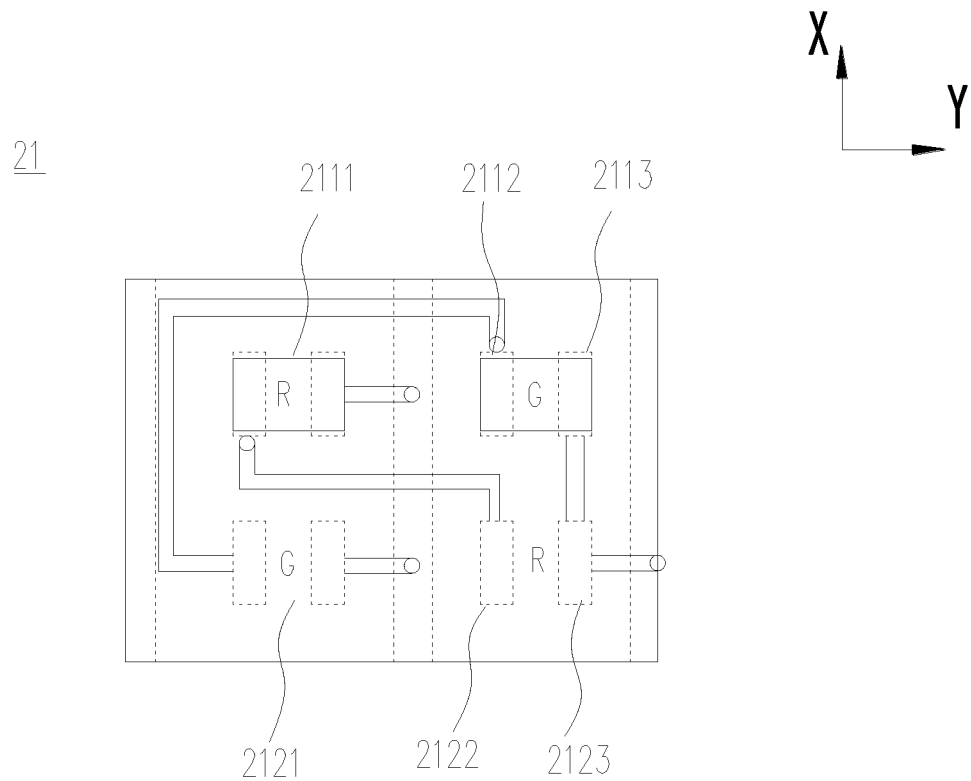
FIG. 7 is an enlarged structural diagram of the first repeating unit shown in FIG. 6.
Figure 8:
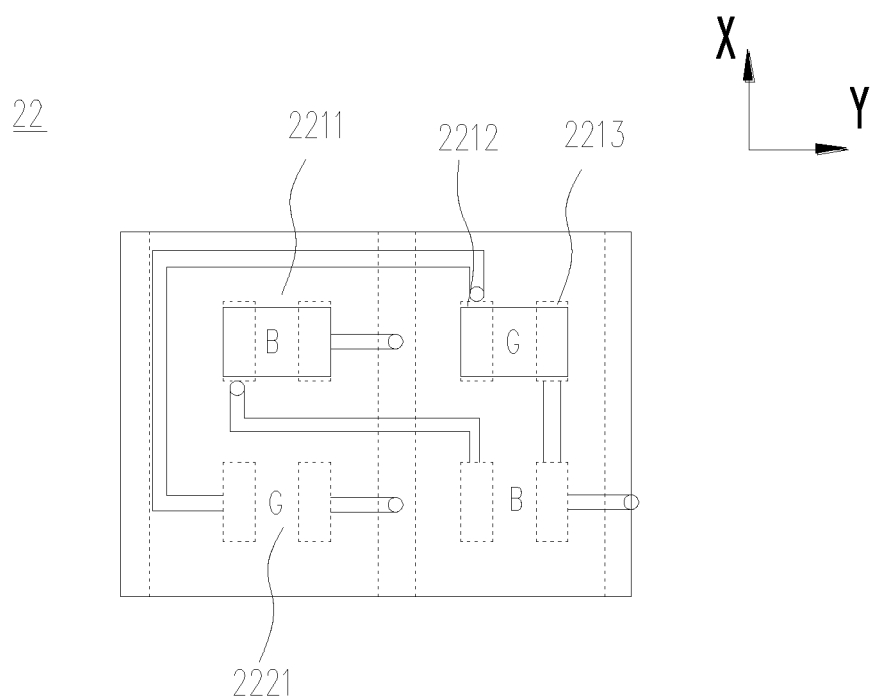
FIG. 8 is an enlarged structural diagram of the second repeating unit shown in FIG. 6.
Figure 9:
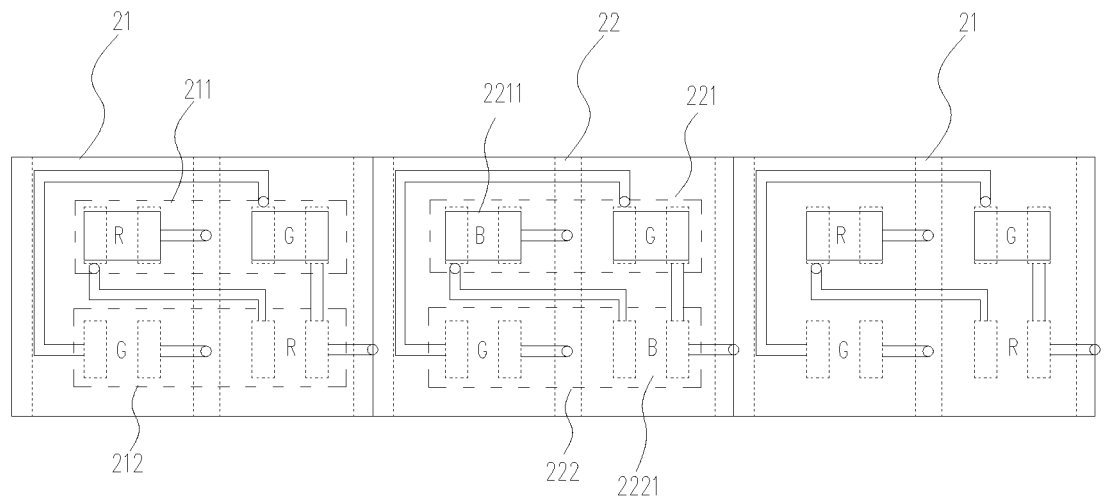
FIG. 9 is a schematic diagram illustrating a position relationship between the first repeating unit and the second repeating unit shown in FIG. 6.

Optionally, as shown in FIGS. 7 and 8, the first electrode 2112 is located at one side of the second electrode 2113 in the second direction Y, and the fifth electrode 2212 is located at one side of the sixth electrode 2213 in the second direction Y.

Figure 2:
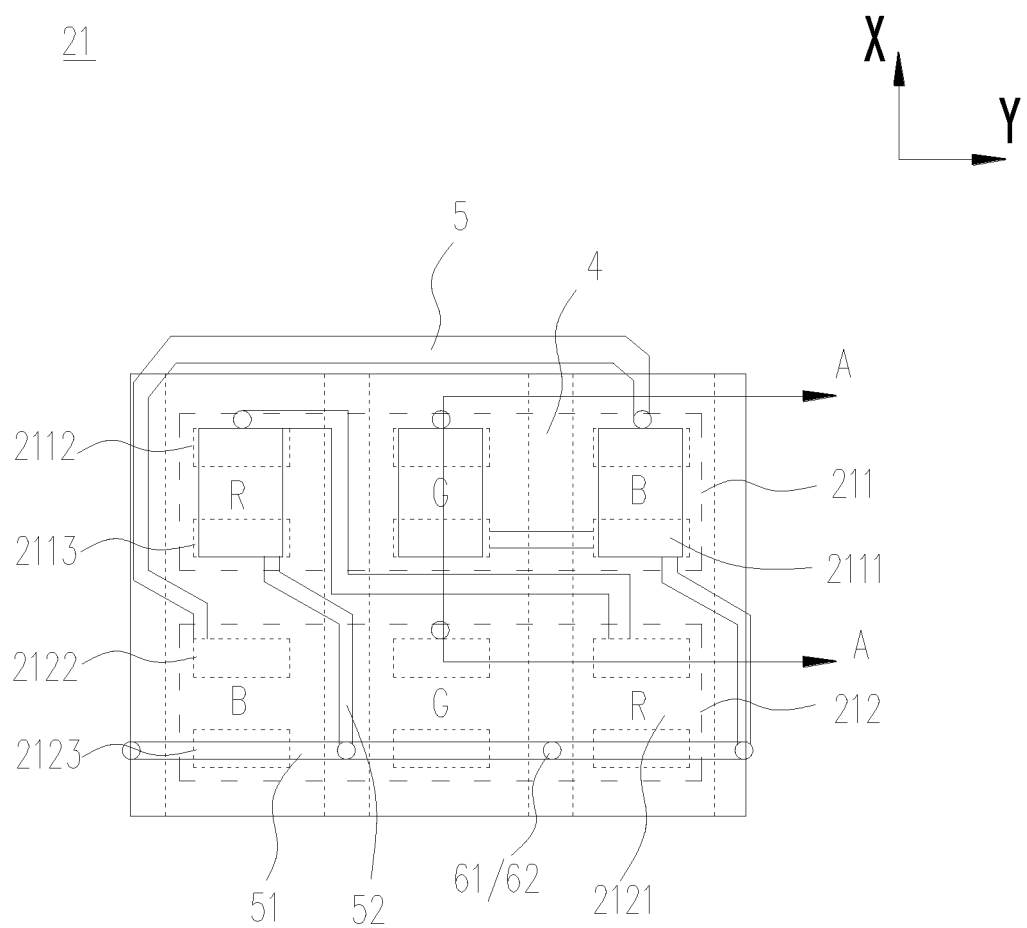
FIG. 2 is an enlarged structural diagram of the first repeating unit shown in FIG. 1.
Figure 3:
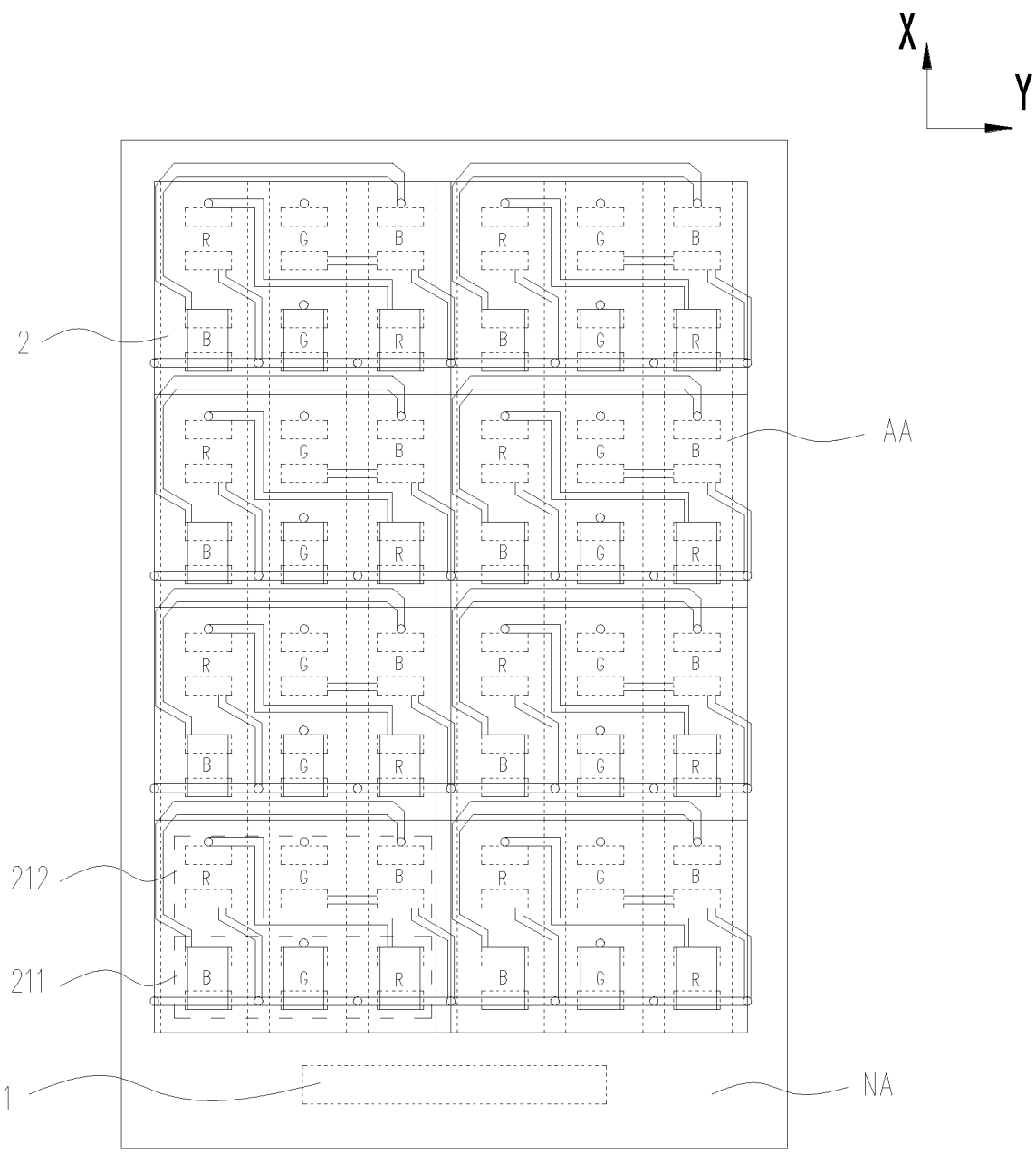
FIG. 3 is a structural diagram of another display panel according to an embodiment of the present application.
Figure 4:
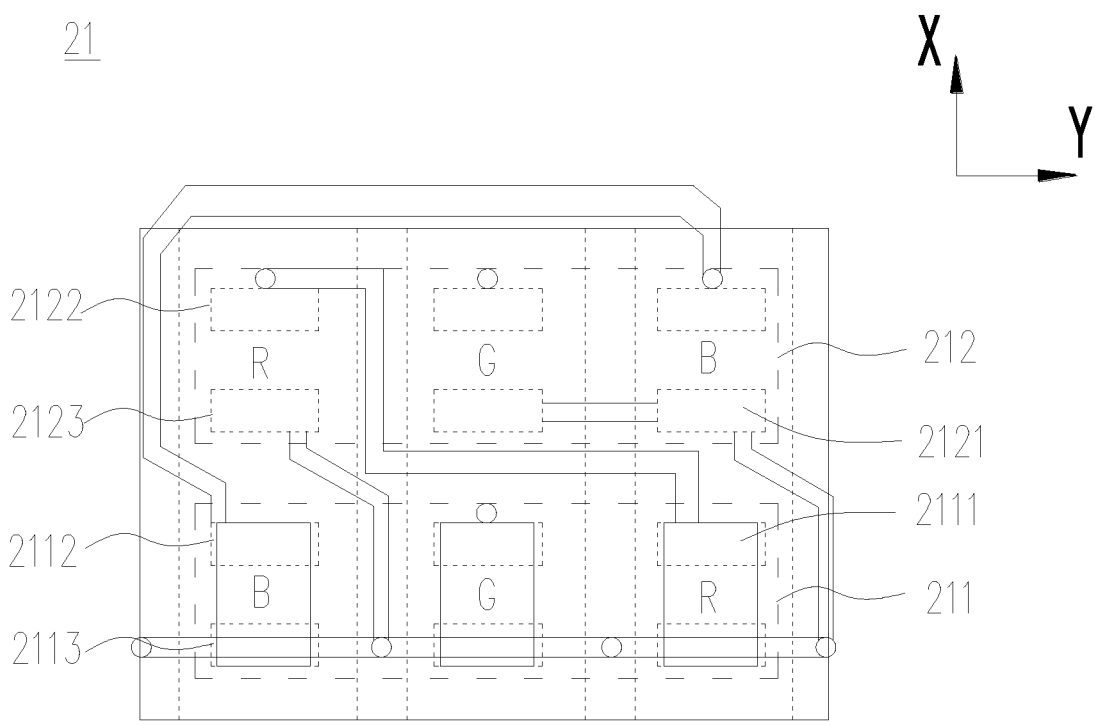
FIG. 4 is an enlarged structural diagram of the first repeating unit shown in FIG. 3.

In some embodiments, as shown in FIG. 2, the display panel may further include an electrode connection line 5.

The first reserved pixel bit 2121 includes a third electrode 2122 and a fourth electrode 2123. Within a same first repeating unit 21, the first electrode 2112 of at least a part of the first display sub-pixels 2111 is electrically connected with the third electrode 2122 of at least a part of the first reserved pixel bits 2121 with the same emissive color through the electrode connection line 5.

The first reserved pixel bit 2121 includes the third electrode 2122 and the fourth electrode 2123, which are positive electrode and negative electrode, respectively. The first electrode 2112 and the third electrode 2122 may be the same type, either positive electrode or negative electrode, and the second electrode 2113 and the fourth electrode 2123 may be the same type, either positive electrode or negative electrode.

Since the first electrode 2112 and the third electrode 2122 may be the same type of electrode, and their corresponding first display sub-pixel 2111 and the first reserved pixel bit 2121 has the same color, so the first electrode 2112 and the third electrode 2122 can be electrically connected to a same signal line. On this basis, in the embodiment of the present application, the first electrode 2112 of a first display sub-pixel 2111 and the third electrode 2122 in a corresponding first reserved pixel bit 2121 are electrically connected through the electrode connection line 5, which simplifies arrangement of wirings and reduces the number of the wirings in the first repeating unit 21.

It should be noted that "the first display sub-pixel 2111 and the first reserved pixel bit 2121 with the same color" mentioned in the embodiment of the present application means that emissive color of the first display sub-pixel 2111 is the same as a preset emissive color of the corresponding first reserved pixel bit 2121.

In some other embodiments, the second electrode 2113 of at least a part of the first display sub-pixels 2111 is electrically connected with and fourth electrode 2123 of the at least of the first reserved pixel bits 2121 with the same emissive color through the electrode connection line 5. For example, there may be a plurality of electrode connection lines 5, a part of which connects the first electrode 2112 and the third electrode 2122, and another part of which connects the second electrode 2113 and the fourth electrode 2123. Further, in the case where the pixel structure 2 includes other repeating units in addition to the first repeating units 21, the other repeating units may also include an electrode connection line 5, which is not limited in the embodiment of the present application.

Figure 10:
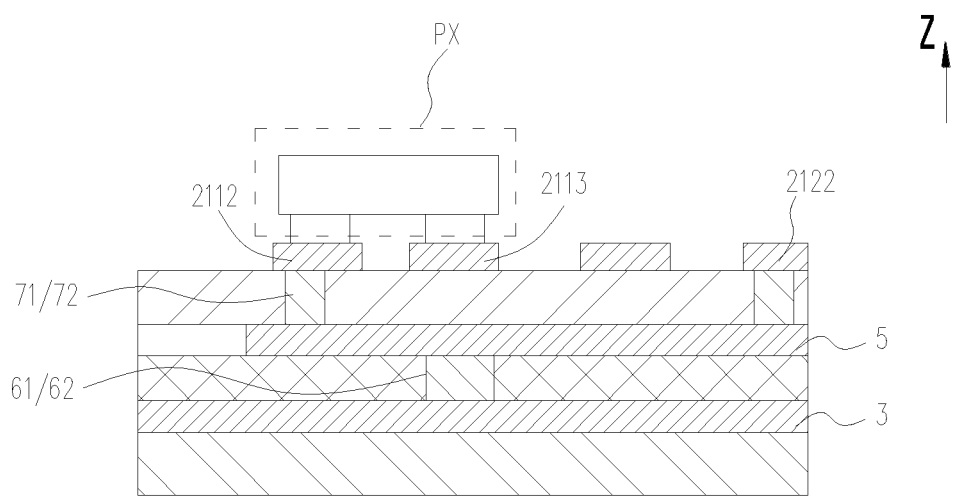
FIG. 10 is a schematic diagram illustrating a sectional structure along A-A in FIG. 2.

In some embodiments, referring to FIGS. 2 and 10, the display panel may further include a first signal line 3 and a second signal line 4. The first electrode 2112 and the third electrode 2122 are electrically connected to the first signal line 3 through the electrode connection line 5.

The first signal line 3 and the second signal line 4 may be a data line and a scanning line of the display panel respectively, and configured to transmit a corresponding driving signal to the positive and negative electrodes of the first display sub-pixel 2111 and the first reserved pixel bit 2121.

It can be seen from the foregoing that the electrode connection line 5 can electrically connect the first electrode 2112 of the first display sub-pixel 2111 and the third electrode 2122 of the first reserved pixel bit 2121 with the same emissive color. On this basis, in the embodiment of the present application, the electrode connection line 5 is also electrically connected to the first signal line 3, so the driving signal on the first signal line 3 can be simultaneously transmitted to the first electrode 2112 of the first display sub-pixel 2111 and the third electrode 2122 of the second reserved pixel bit 2221 through the electrode connection line 5, which can further reduce the number of wirings in the first repeating unit 21, and thus complexity in arrangement of wirings can be reduced.

In some other embodiments, the second electrode 2113 and the fourth electrode 2123 are electrically connected to the second signal line 4 through the electrode connection line 5. Similarly, in the embodiment of the present application, the driving signal on the second signal line 4 can be simultaneously transmitted to the second electrode 2113 of the first display sub-pixel 2111 and the fourth electrode 2123 of the second reserved pixel bit 2221 through the electrode connection line 5, which can further reduce the number of wirings in the first repeating unit 21.

In some embodiments, as shown in FIG. 10, the display panel may further include a first via 61 penetrating at least a part of film layers along a thickness direction Z and a first signal connection line 62 located in the first via 61. The electrode connection line 5 is electrically connected to the first signal line 3 and/or the second signal line 4 through the first signal connection line 62.

Compared with related arts, the display panel according to the embodiment of the present application includes not only the plurality of first display sub-pixels 2111 but also the plurality of first reserved pixel bits 2121 in the first repeating unit 21, so a signal line should be connected to both an electrode position of the first display sub-pixel 2111 and an electrode position of the first reserved sub-pixel. In order to reduce the number and complexity of wirings, the electrode connection line 5 is additionally provided for connecting the first electrode 2112 and the corresponding third electrode 2122, or connecting the second electrode 2113 and the corresponding fourth electrode 2123.

On this basis, in the embodiment of the present application, at least one of the first signal line 3 and the second signal line 4 is disposed at a different layer than the electrode connection line 5, so that the at least one of the first signal line and the second signal line 4 is electrically connected with the electrode connection line 5 through the first via 61 and the first signal connection line 62 located in the first via 61, which can reduce the number of and difficulty in arrangement of wirings in a same layer as the electrode connection line 5.

It should be noted that in the embodiment of the present application, there may be multiple electrode connection lines 5, which may be disposed in a same layer or different layers. The first signal line 3 and the second signal line 4 may be disposed in a different layer than a part of the electrode connection lines 5.

In some embodiments, as shown in FIG. 2, at least a part of the electrode connection lines 5 is electrically connected to the second signal line 4 through the first signal connection line 62. The second signal line 4 extends along the first direction X. The electrode connection line 5 includes a first part 51 extending along the second direction Y and connecting the fourth electrode 2123 and a second part 52 electrically connecting the first part 51 and the second electrode 2113. An orthographic projection of the first via 61 in the thickness direction of the display panel at least partially overlaps with an orthographic projection of the first part 51 in the thickness direction.

The second signal line 4 extends along the first direction X, so it can be determined that the second signal line 4 may be a data line of the display panel for transmitting a corresponding data signal. The electrode connection line 5 includes the first part 51 connecting the fourth electrode 2123 and the second part 52 connecting the first part 51 and the second electrode 2113. The second electrode 2113 and the fourth electrode 2123 are electrically connected through the first part 51 and the second part 52.

Further, since the first part 51 extends along the second direction Y and the second signal line 4 extends along the first direction X, the first part 51 partially overlaps with the second signal line 4. On this basis, in the embodiment of the present application, the first part 51 and the second signal line 4 are disposed in different layers and the orthographic projection of the first via 61 in the thickness direction of the display panel at least partially overlaps with the orthographic projection of the first part 51 in the thickness direction, so as to realize an electrical connection between the first part 51 and the second signal line 4.

It should be noted that the "orthographic projection of the first via 61 in the thickness direction of the display panel" mentioned in the embodiment of the present application means that there are multiple parallel planes which are perpendicular to the thickness direction of the display panel, and the orthographic projection of the first via 61 in the thickness direction of the display panel is an orthographic projection of the first via 61 in any of the planes. The orthographic projection of the first part 51 in the thickness direction also have the same meaning, and will not be repeated in the embodiment of the present application.

Optionally, an orthographic projection of a junction of the first part 51 and the second part 52 in the thickness direction at least partially overlaps with the orthographic projection of the first via 61 in the thickness direction.

In some embodiments, still referring to FIG. 2. the third electrode 2122 is located at one side of the fourth electrode 2123 in the first direction X, and the first part 51 connects adjacent fourth electrodes 2123.

In the embodiments of the present application, the first part 51 is not only used to connect the second part 52 and the fourth electrode 2123, but also electrically connect adjacent fourth electrodes 2123 in a same first repeating unit 21, which further simplifies and reduces difficult in arrangement of wirings in the first repeating unit 21.

In some embodiments, as shown in FIG. 10, the electrode connection line 5 is located between the first signal line 3 and the first electrode 2112 in the thickness direction Z. The display panel may further include a second via 71 which is disposed at one side of the electrode connection line 5 facing the first electrode 2112 and a second signal connection line 72 located in the second via 71. The first electrodes 2112 of at least a part of the first display sub-pixels 2111 and the third electrodes 2122 of at least part of the first reserved pixel bits 2121 with the same emissive color are electrically connected to the electrode connection line 5 through the second signal connection line 72.

The first electrode 2112 of a first display sub-pixel 2111 and the third electrode 2122 of a corresponding first reserved pixel bit 2121 with the same emissive color are electrically connected through the electrode connection line 5, and are electrically connected to a corresponding second signal line 4. Unlike the second electrode 2113 and the fourth electrode 2123, scanning signals corresponding to different emissive colors are different, so first electrodes 2112 of different emissive colors cannot be electrically connected to each other, and third electrodes 2122 of different emissive colors cannot be electrically connected to each other.

Since first electrodes 2112 of first display sub-pixels 2111 with different emissive colors should be electrically connected with third electrodes 2122 of respective first reserved pixel bits 2121 with corresponding emissive colors, so in the embodiment of the present application, the electrode connection line 5 is disposed in a different layer than the first electrode 2112 and the third electrode 2122 such that it is located between the first signal line 3 and the first electrode 2112 in the thickness direction Z in order to reduce difficulty in arrangements of wirings. The first electrode 2112 and the third electrode 2122 are electrically connected with the electrode connection line 5 through the second via 71 and the second signal connection line 72 located in the second via 71, and in turn the electrode connection line 5 is electrically connected to the corresponding first signal line 3 through the first via 61, so as to achieve an electrically connection of the first electrode 2112 and the third electrode 2122 with the corresponding first signal line 3.

In some embodiments, as shown in FIGS. 2 and 10, within a same first repeating unit 21, the number of the first display sub-pixels 2111 may be at least three, and the first electrode 2112 of at least a part of the first display sub-pixels 2111 which is located at the center is disposed in a different layer from the electrode connection line 5, and is electrically connected with the electrode connection line 5 through the second via 71.

In a case where the number of first display sub-pixels 2111 in the first repeating unit 21 is greater than or equal to three, in each of the first display sub-pixels 2111 at both sides, the electrode connection line 5 connected with the first electrode 2112 can be disposed in a same layer as the first electrode 2112, and the electrode connection line 5 can be connected from the side to the corresponding third electrode 2122. In the first display sub-pixel 2111 at the center, if the electrode connection line 5 connected with the first electrode 2112 is disposed in a same layer as the first electrode 2112, it might overlap with the electrode connection line 5 for another first display sub-pixel 2111 with a different emissive color, which may easily cause signal crosstalk and other problems.

In order to reduce risks of occurrence of the above problems, in the embodiment of the present application, the first electrode 2112 in at least a part of the first display sub-pixels 2111 which is located at the center is disposed in a different layer from the electrode connection line 5 and is electrically connected with the electrode connection line 5 through the second via 71. This design reduces risks of overlap of electrode connection lines 5 in a same layer. Further, the electrode connection line 5 connected with the first display sub-pixel 2111 at each of the sides can be disposed in an area between the first display sub-pixel 2111 and the first reserved pixel bit 2121, and thus can be connected to the fourth electrode 2123 of the corresponding first reserved pixel bit 2121.

In some embodiments, at least one of the first electrode 2112 and the second electrode 2113 is disposed in a same layer as at least a part of the electrode connection lines 5.

In the embodiment of the present application, at least one of the first electrode 2112 and the second electrode 2113 is disposed in a same layer as the electrode connection line 5, so they can be prepared at the same time in a same process during preparation, and thus preparation efficiency can be improved.

In some embodiments, the first electrode 2112 and the second electrode 2113 may be disposed in different layers.

In the embodiments of the present application, the light-emitting chip transferred to the display panel may be a vertical structure, so that the first electrode 2112 and the second electrode 2113 may be disposed in different layers. Further, the electrode connection line 5 connected with the first electrode 2112 can be disposed in a same layer as the first electrode 2112, and the electrode connection line 5 connected with the second electrode 2113 can be disposed in a same layer as the second electrode 2113, which can avoid wiring interference between the electrode signal line connected with the first electrode 2112 and the electrode signal line connected with the second electrode 2113, and further reduce the wiring difficulty.

In addition, the third electrode 2122 and the fourth electrode 2123 may be disposed in different layers. The third electrode 2122 is disposed in a same layer as the first electrode 2112, and the fourth electrode 2123 is disposed in a same layer as the second electrode 2113.

In some embodiments, within a same first display sub-pixel 2111, the first electrode 2112 is located at one side of the second electrode 2113 in the first direction X, and within the first reserved pixel bit 2121, the third electrode 2122 is located at one side of the fourth electrode 2123 in the first direction X.

In the embodiment of the present application, the first electrode 2112 and the second electrode 2113 are disposed side by side along the first direction X, and the third electrode 2122 and the fourth electrode 2123 are also disposed side by side along the first direction X. This design makes it easier to plan arrangement of the electrode connection lines 5 and reduces difficulty in arrangement of the electrode connection lines 5.

In some embodiments, as shown in FIGS. 1 and 2, within the first display sub-pixel 2111, the first electrode 2112 is located at the side of the second electrode 2113 away from the driving chip 1; and within the first reserved pixel bit 2121, the third electrode 2122 is located at the side of the fourth electrode 2123 away from the driving chip 1.

The first electrode 2112 and the third electrode 2122 are located at the same side of the second electrode 2113 and the fourth electrode 2123, respectively, so risks of arrangement of the electrode connection lines 5 being difficult due to there is a too larger distance between the first electrode 2112 and the third electrode 2122 in the first direction X can be avoided.

It should be noted that in the embodiments of the present application, the first electrode 2112 and the third electrode 2122 are not limited to positive electrodes. The first electrode 2112 and the third electrode 2122 may be negative electrodes, which is not limited in the embodiments of the present application.

In some embodiments, as shown in FIG. 7, within the first display sub-pixel 2111, the first electrode 2112 and the second electrode 2113 are disposed oppositely and spaced in the second direction Y. Within the first reserved pixel bit 2121, the third electrode 2122 and the fourth electrode 2123 are disposed oppositely and spaced in the second direction Y.

In the embodiment of the present application, the first electrode 2112 and the second electrode 2113 are oppositely disposed in the second direction Y, and the third electrode 2122 and the fourth electrode 2123 are spaced in the second direction Y. This design can reduce a distance between the first electrode 2112 and the third electrode 2122 in the first direction X, as well as a distance between the second electrode 2113 and the fourth electrode 2123 in the first direction X. Further, the fourth electrode 2123 may be disposed closer to the second signal line 4, so that an extension length of the first part 51 which is extended along the second direction Y and connects the fourth electrode 2123 is smaller, which further simplifies arrangement of wirings.

In some embodiments, within a same first display sub-pixel 2111 and a same first reserved pixel bit 2121, location of the first electrode 2112 with respect to the second electrode 2113 is the same as location of the third electrode 2122 with respect to the fourth electrode 2123 in the second direction Y.

The first electrode 2112 and the third electrode 2122 are located at the same side of the second electrode 2113 and the fourth electrode 2123, respectively, so risks of arrangement of the electrode connection lines 5 being difficult due to there is a too larger distance between the first electrode 2112 and the third electrode 2122 in the second direction Y can be avoided.

In some embodiments, the first repeating unit 21 includes two first display sub-pixels 2111. Within the first repeating unit 21, the number of the first display sub-pixels 2111 corresponds to the number of the first reserved pixel bits 2121. The smaller the number of the first display sub-pixels 2111, the lower difficulty in arrangements of wirings in the first repeating unit 21. Therefore, in the embodiment of the present application, there are two first display sub-pixels 2111 in the first repeating unit 21, which further reduces difficulty in arrangements of wirings in the first repeating unit 21.

It should be noted that in order to achieve better display effects, the pixel structure 2 may include not only the first repeating units 21 but also other repeating units, so as to meet display gamut requirements of the display panel.

In a second aspect, as shown in FIG. 5, the embodiments of the present application provides a splicing display device, including a first sub-screen P1 and a second sub-screen P2 that are spliced with each other in the first direction X. Each of the first sub-screen P1 and the second sub-screen P2 includes the display panel in any of the preceding embodiments.

In the first sub-screen P1, the driving chip 1 is located at one side of the pixel structure 2 away from the second sub-screen P2. In the second sub-screen P2, the driving chip 1 is located at one side of the pixel structure 2 away from the first sub-screen P1. In the first repeating unit 21 of one of the first sub-screen P1 or the second sub-screen P2, the first display pixel group 211 is located at one side of the first reserved pixel group 212 away from the driving chip 1; and in the first repeating unit 21 of the other of the first sub-screen P1 or the second sub-screen P2, the first display pixel group 211 is located at one side of the first reserved pixel group 212 near the driving chip 1.

The splicing display device in the embodiments of the present application includes at least two display panels, the first sub-screen P1 and the second sub-screen P2. Although each of the first sub-screen P1 and the second sub-screen P2 may be the display panel in any of the above embodiments, location of the first display pixel group 211 with respect to the first reserved pixel group 212 in the first sub-screen P1 is in reverse to location of the first display pixel group 211 with respect to the first reserved pixel group 212 in the second sub-screen P2, that is, during transferring of light-emitting chips, transferred positions of the light-emitting chips are different.

When forming the splicing display device, one of the first sub-screen P1 and the second sub-screen P2 needs to be rotated by 180 degrees, such that their driving chips 1 are all located at a side of the display area away from a splicing joint. The design of the first sub-screen P1 and the second sub-screen P2 makes that an ordering of emissive colors of the first display sub-pixels in the upper display area of the splicing display device is the same as that in the lower display area of the splicing display device, and thus the splicing display device will not have the problem of display color mismatch, which can further improve display effects of the splicing display device.

It should be noted that the splicing display device according to the embodiments of the present application can obtain beneficial effects of the display panel in any of the preceding embodiments. For details, please refer to the foregoing description of the display panel, and they will not be repeated in the embodiments of the present application.

Figure 11:
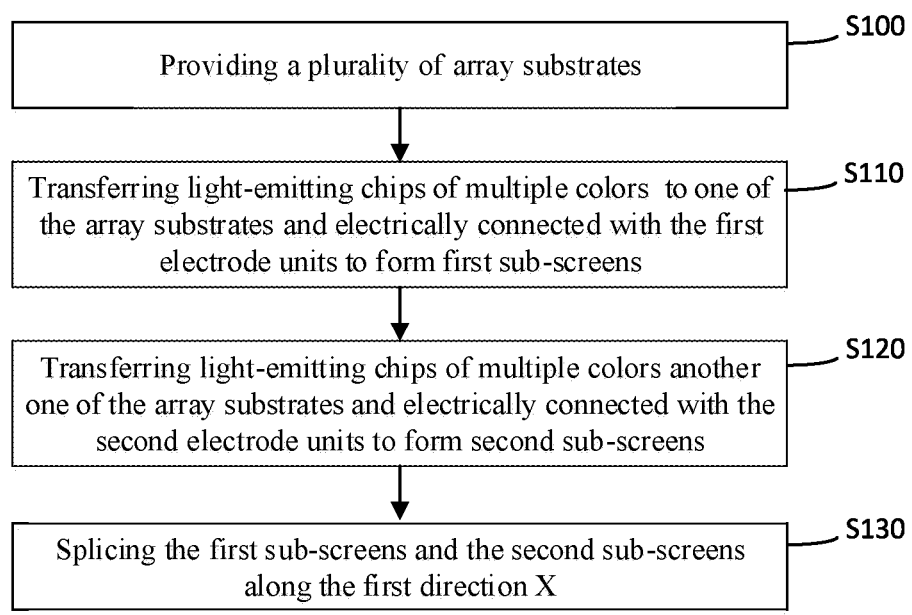
FIG. 11 is a flowchart of a method for preparing a splicing display device according to an embodiment of the present application.

In a third aspect, referring to FIGS. 11 and 12, the embodiments of the application provides a method for preparing a splicing display device, including steps S100 to S130.

At step S100: a plurality of array substrates are provided.

Figure 12A:
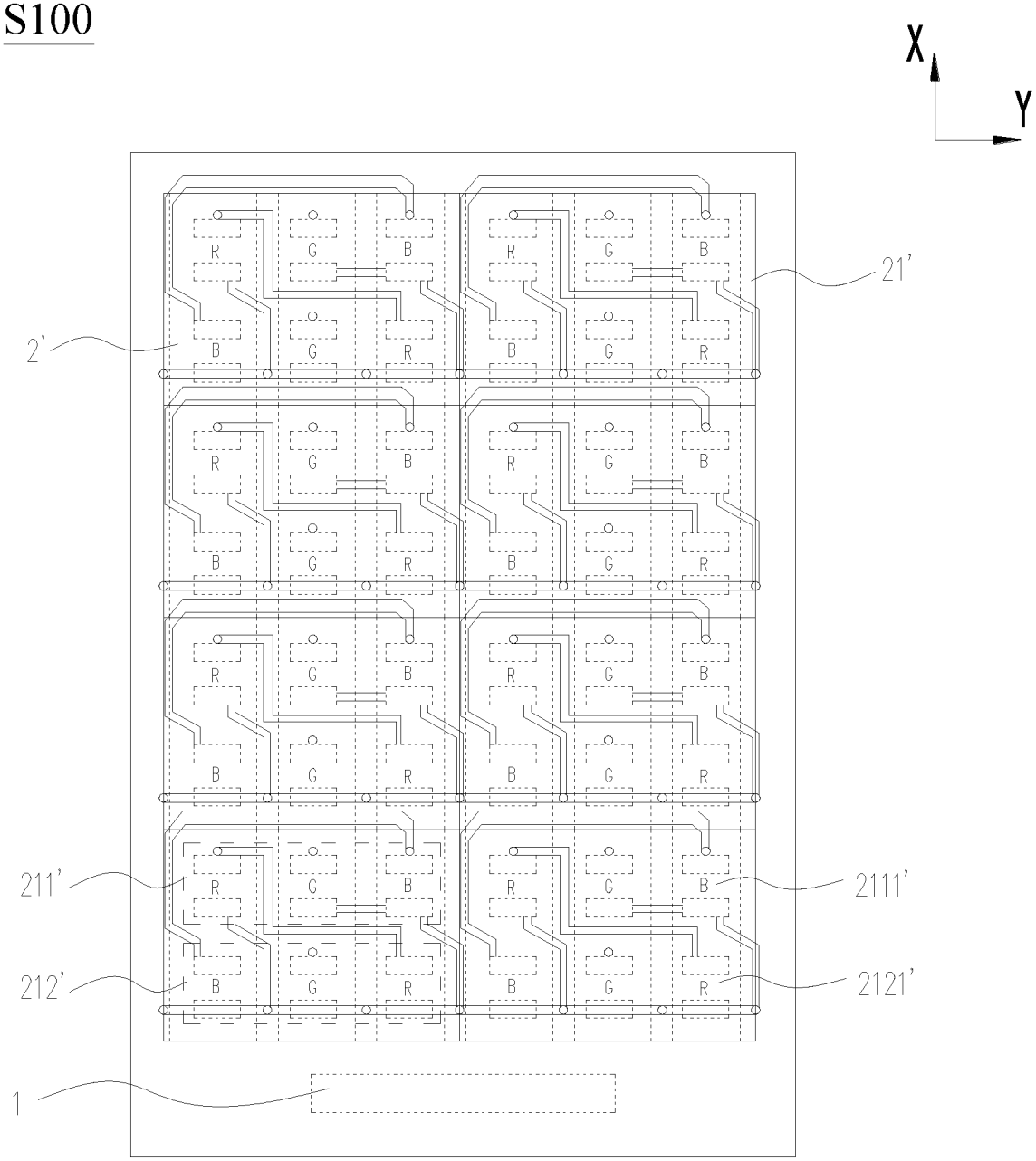
FIGS. 12a to 12d are schematic diagrams illustrating various structures during processes of a method for preparing a splicing display device according to an embodiment of the present application.

Referring to FIG. 12*a*, at step S100, the array substrate includes a driving chip 1 and an electrode arrangement structure 2' which are spaced in a first direction X. The electrode arrangement structure 2' includes a plurality of electrode repeating units 21', and the electrode repeating unit 21' includes a first electrode group 211' and a second electrode group 212' which are arranged side by side along the first direction X. The first electrode group 211' includes a plurality of first electrode units 2111' which are dispose side by side along a second direction Y, and the second electrode group 212' includes a plurality of second electrode units 2121' which are disposed side by side along the second direction Y and electrically connected with the first electrode units 2111'.

Light-emitting chips can be transferred to the first electrode group 211' to realize light emission, or to the second electrode group 212' to realize light emission. The first electrode units 2111' in the first electrode group 211' and the second electrode units 2121' in the second electrode group 212' are used to receive corresponding light-emitting chips. Each of the first electrode units 2111' and the second electrode units 2121' includes two electrodes as a positive electrode and a negative electrode, which are electrically connected with corresponding signal lines.

In addition, the positive electrode of a first electrode unit 2111' is electrically connected with the positive electrode of a corresponding second electrode unit 2121' and the both electrodes are connected to a same signal line. The negative electrode of the first electrode unit 2111' is electrically connected with the negative electrode of the corresponding second electrode unit 2121', and the both electrodes are connected to a same signal line. For example, the first electrode unit 211*l'* includes a first electrode and a second electrode, and the second electrode unit 2121' includes a third electrode and a fourth electrode. The first electrode is electrically connected with the third electrode, and the second electrode is electrically connected with the fourth electrode.

At step S110, light-emitting chips of multiple colors are transferred to one of the array substrates and electrically connected with the first electrode units to form first sub-screens.

Figure 12B:
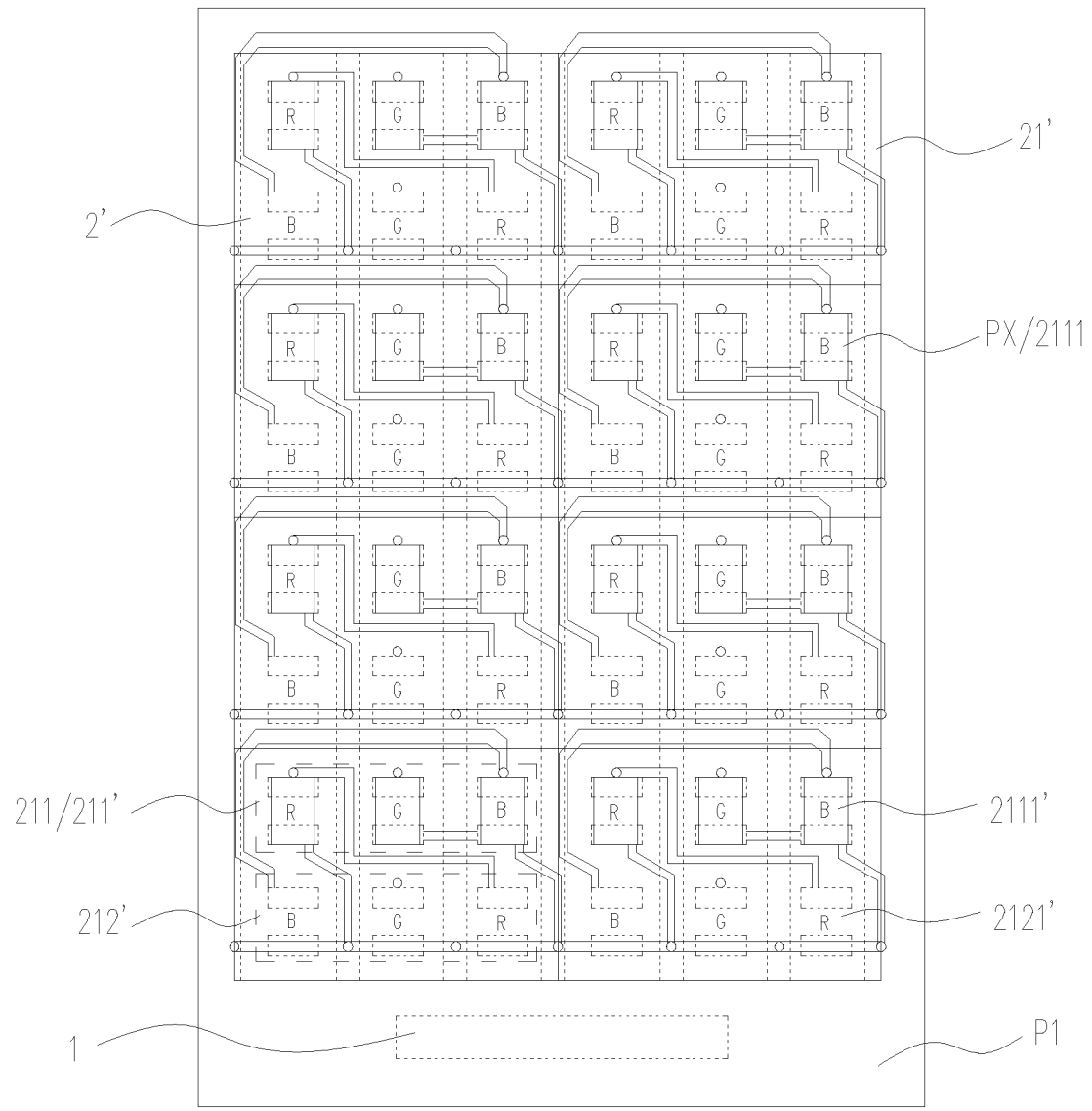

Referring to FIG. 12*b*, at step S110, a plurality of light-emitting chips PX are transferred to the plurality of first electrode units 2111' of the first electrode group 211' to form the first display sub-pixels 2111. The position where the first electrode group 211' is located is the position of the first display pixel group 211 in the first sub-screen P1.

At step S120, light-emitting chips of multiple colors are transferred to another one of the array substrates and electrically connected with the second electrode units to form second sub-screens.

Figure 12C:
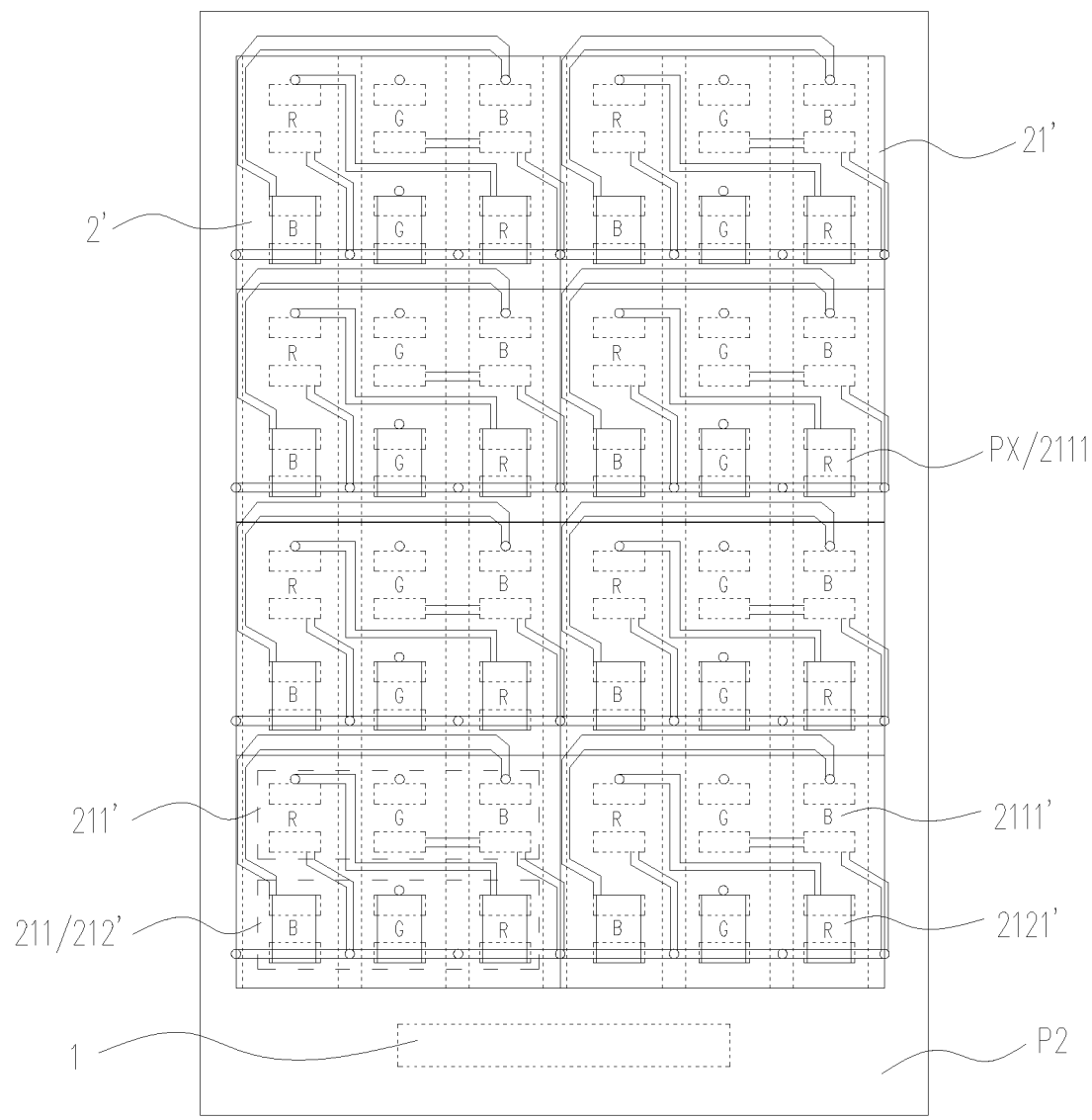

Referring to FIG. 12c, at step S120, a plurality of light-emitting chips PX are transferred to the plurality of second electrode units 2121' of the second electrode group 212' to form the first display sub-pixels 2111. The position where the second electrode group 212' is located is the position of the second display pixel group 211 in the second sub-screen P2.

Further, an ordering of emissive colors of the light-emitting chips PX along the second direction Y in the first sub-screen P1 is in reverse to an ordering of emissive colors of the light-emitting chips PX along the second direction Y in the second sub-screen P1. The "ordering of emissive colors" mentioned here has the same meaning as that in the previous embodiments, and will not be repeated in the embodiment of the present application.

At S130: the first sub-screens and the second sub-screens are spliced along the first direction X.

Figure 12D:
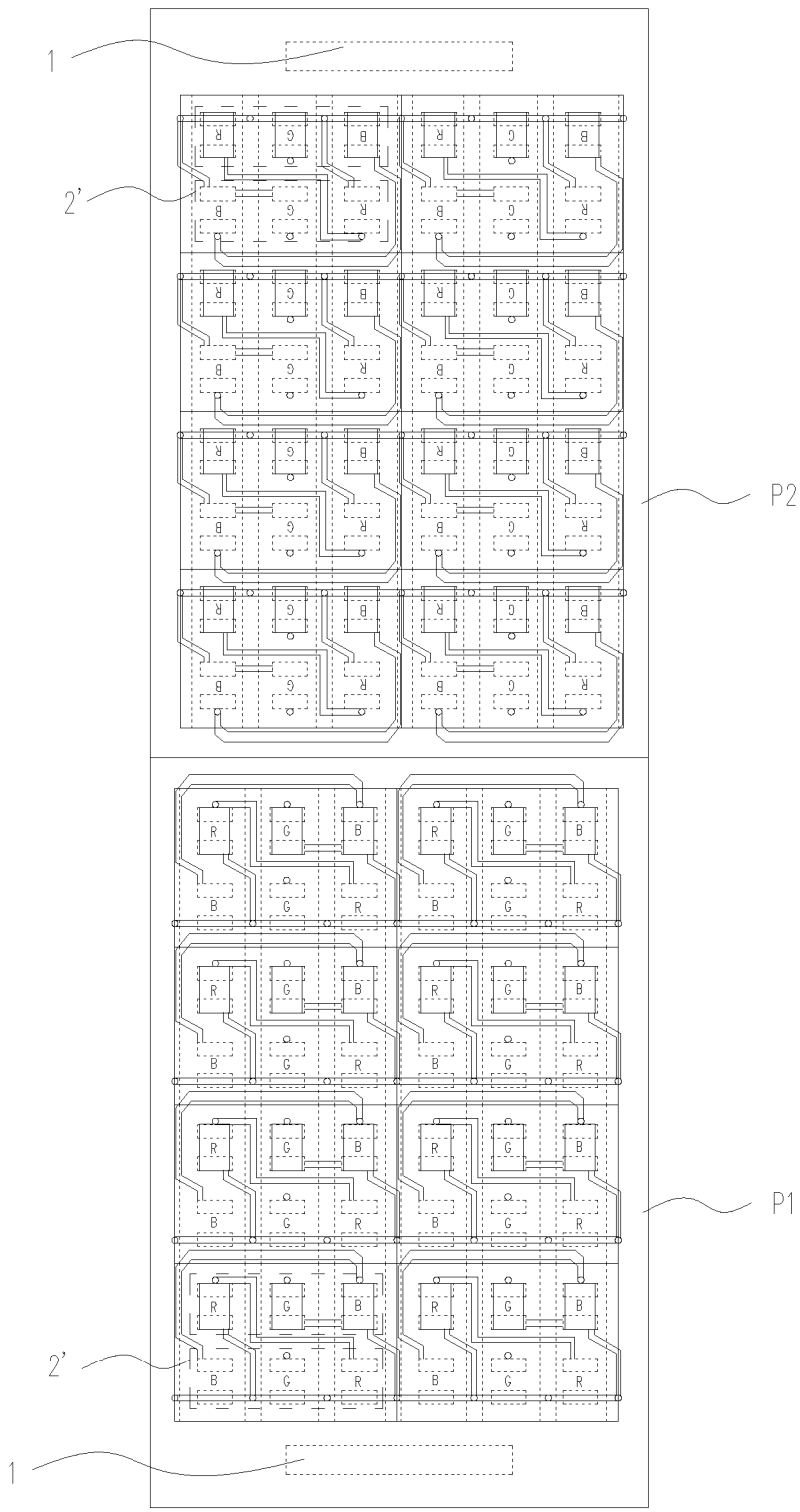

Referring to FIG. 12d, at step S130, within the first sub-screen P1, the driving chip 1 is located at one side of the electrode arrangement structure 2' away from the second sub-screen P2; and within the second sub-screen P2, the driving chip 1 is located at one side of the electrode arrangement structure 2' away from the first sub-screen P1.

The first sub-screen P1 and the second sub-screen P2 are spliced along the first direction X, wherein one of the first sub-screen P1 and the second sub-screen P2 has been rotated 180 degrees, such that each of the driving chip 1 is located at the side of the electrode arrangement structure 2' away from a splicing joint.

In the splicing display device prepared by the embodiment of the present application, the upper display area and the lower display area have the same ordering of emissive colors, so there will be no display color mismatch. Further, each of the driving chips 1 is disposed away from the splicing joint, so there will be no larger non-display area near the splicing joint, which can improve display effects of the splicing display device.

Figure 13:
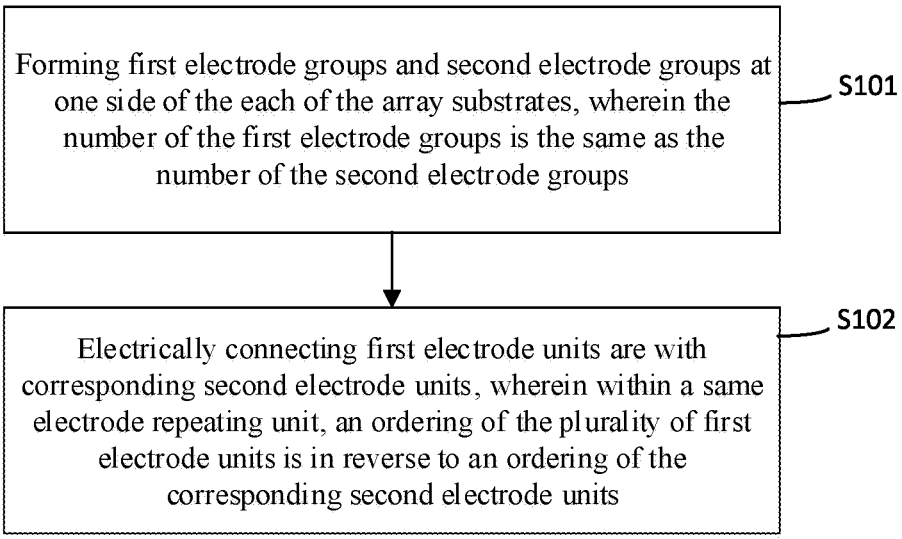
FIG. 13 is a flowchart of another method for preparing a splicing display device according to an embodiment of the present application.

In some embodiments, referring to FIGS. 13 and 14, the step S100 may include steps S101 to S102.

At step S101: first electrode groups and second electrode groups are formed at one side of the each of the array substrates, wherein the number of the first electrode groups is the same as the number of the second electrode groups.

Figure 14A:
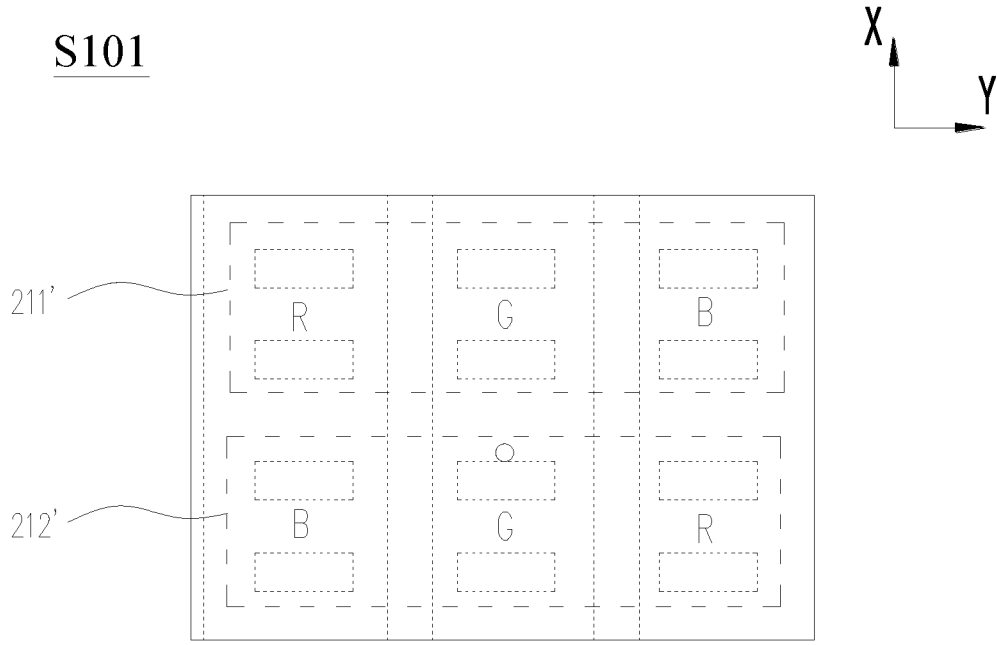
FIGS. 14a to 14b are schematic diagrams illustrating various structures during processes of another method for preparing a splicing display device according to an embodiment of the present application.

Referring to FIG. 14a, at step S101, the first electrode group 211' and the second electrode group 212' are disposed at a same side of the substrate. For example, the first electrode group 211' and the second electrode group 212' are disposed in a same layer.

At step S102: first electrode units are electrically connected with corresponding second electrode units, wherein within a same electrode repeating unit, an ordering of the plurality of first electrode units is in reverse to an ordering of the corresponding second electrode units.

Figure 14B:
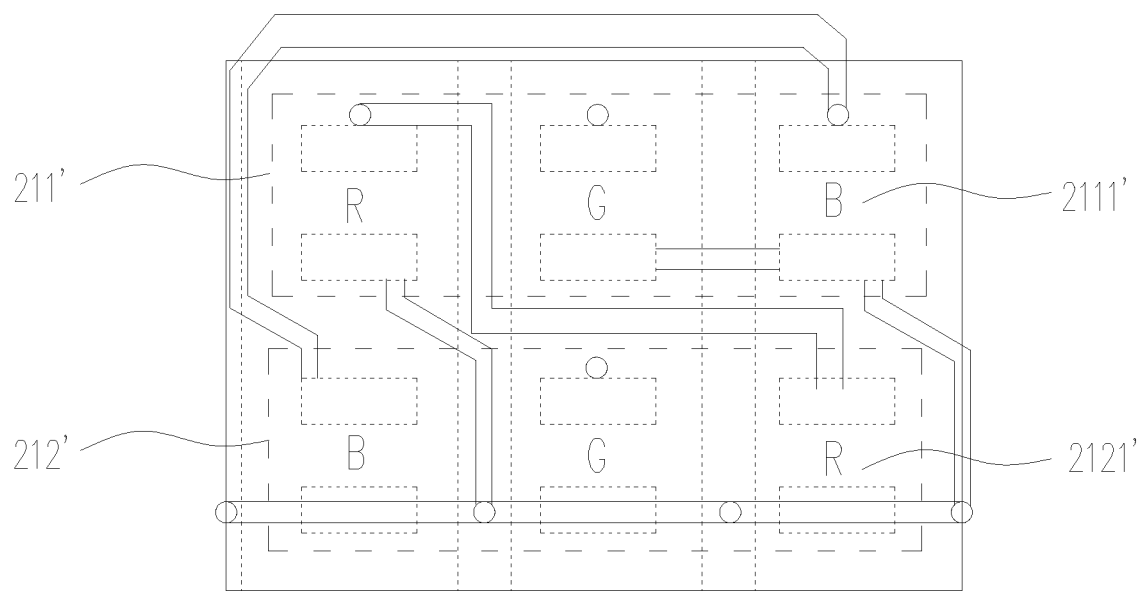

Referring to FIG. 14b, at step S102, a first electrode units 211l' and a second electrode units 2121' that can be used to control light-emitting chips with the same emissive color are electrically connected with each other in the embodiment of the present application. Optionally, the first electrode unit 211l' and its corresponding second electrode unit 2121' can be electrically connected through an electrode connection line 5. This design can reduce the number of and difficulty in arrangements of wirings in the electrode repeating unit. Further, the first electrode unit 2111' and its corresponding second electrode unit 2121' can be electrically connected with a same signal line.

Although the present application has been described with reference to the above discussed embodiments, these descriptions are provided only for convenience of understanding the present application and are not intended to limit the present application. Various modifications and changes in form and details of the implementations can be made by those skilled in the art without departing from the spirit and scope of the present application, but the protection scope of the present application is still defined in the attached claims.

The above descriptions only provide specific implementations of the present application, and it can be clearly understood by those skilled in the art that for the convenience and conciseness of the description, other connections as replacements of the above descriptions can be determined from corresponding processes in the above method embodiments, and will not be repeated here. It should be understood that the protection scope of the present application is not limited to the above descriptions. Various equivalent modifications or replacements can be easily conceived by those skilled in the art within the technical scope disclosed in the present application. These modifications or replacements should fall within the protection scope of the present application.

What is claimed is:

1. A display panel, comprising:
   a display area, and
   a non-display area surrounding periphery of the display area, and
   the display panel comprising:
      a driving chip located in the non-display area at one side of the display area in a first direction; and
      a pixel structure comprising a plurality of first repeating units which are located in the display area, the first repeating unit comprising a first display pixel group and a first reserved pixel group which are disposed side by side along the first direction, wherein the first display pixel group comprises a plurality of first display sub-pixels disposed along a second direction, the first reserved pixel group comprises a plurality of first reserved pixel bits disposed along the second direction, the first direction intersects with the second direction, and the first display pixel group and the first reserved pixel group are configured not to emit light simultaneously;
   wherein within the first repeating unit, an ordering of emissive colors of the plurality of first display sub-pixels along the second direction is in reverse to a preset ordering of emissive colors of the plurality of first reserved pixel bits along the second direction.

2. The display panel according to claim 1, wherein the pixel structure further comprises a plurality of second repeating units which are alternately disposed with the plurality of first repeating units in the first direction and in the second direction, wherein the second repeating unit comprises a second display pixel group and a second reserved pixel group which are disposed along the first direction, wherein the second display pixel group comprises a plurality of second display sub-pixels disposed along the second direction, and the second reserved pixel group comprises a plurality of second reserved pixel bits which are disposed along the second direction, wherein within the second repeating unit, an ordering of emissive colors of the plurality of second display sub-pixels along the second direction is in reverse to a preset ordering of emissive colors of the plurality of second reserved pixel bits along the second direction; and
   wherein at least a part of the second display sub-pixels has different emissive colors from any of the first display sub-pixels.

3. The display panel according to claim 2, wherein at least a part of the second display sub-pixels has the same emissive colors as at least a part of the first display sub-pixels.

4. The display panel according to claim 2, wherein the first display sub-pixel comprises a first electrode and a second electrode, the second display sub-pixel comprises a fifth electrode and a sixth electrode, and an arrangement direction of the first electrode and the second electrode is parallel to an arrangement direction of the fifth electrode and the sixth electrode.

5. The display panel according to claim 1, wherein the display panel further comprises an electrode connection line, the first display sub-pixel includes a first electrode and a second electrode, and the first reserved pixel bit includes a third electrode and a fourth electrode;
within a same first repeating unit, the first electrode of at least a part of the first display sub-pixels is electrically connected with the third electrode of at least a part of the first reserved pixel bits with the same emissive color through the electrode connection line; and/or,
the second electrode of at least a part of the first display sub-pixels is electrically connected with the fourth electrode of at least a part of the first reserved pixel bits with the same emissive color through the electrode connection line.

6. The display panel according to claim 5, wherein the display panel further comprises a first signal line and a second signal line, wherein the first electrode and the third electrode are electrically connected to the first signal line through the electrode connection line; and/or,
the second electrode and the fourth electrode are electrically connected to the second signal line through the electrode connection line.

7. The display panel according to claim 6, wherein the display panel may further comprises a first via penetrating at least a part of film layers along a thickness direction and a first signal connection line located in the first via, wherein the electrode connection line is electrically connected to the first signal line and/or the second signal line through the first signal connection line.

8. The display panel according to claim 7, wherein in a case where there are multiple electrode connection lines, at least a part of the electrode connection lines is electrically connected to the second signal line through the first signal connection line, wherein the second signal line extends along the first direction, and the electrode connection line includes a first part extending along the second direction and connecting the fourth electrode and a second part electrically connecting the first part and the second electrode, and wherein an orthographic projection of the first via in the thickness direction overlaps an orthographic projection of the first part in the thickness direction.

9. The display panel according to claim 8, wherein the third electrode is located at one side of the fourth electrode in the first direction, and the first part connects adjacent fourth electrodes.

10. The display panel according to claim 7, wherein the electrode connection line is located between the first signal line and the first electrode in the thickness direction, and the display panel further comprises a second via which is disposed at one side of the electrode connection line facing the first electrode and a second signal connection line located in the second via, wherein the first electrode of at least a part of the first display sub-pixels and the third electrode of at least a part of the first reserved pixel bits with the same emissive color are connected to the electrode connection line through the second signal connection line.

11. The display panel according to claim 10, wherein within a same first repeating unit, the number of the first display sub-pixels is at least three, the first electrode of at least a part of the first display sub-pixels which is located at the center is disposed in a different layer from the electrode connection line, and is electrically connected with the electrode connection line through the second via.

12. The display panel according to claim 5, wherein at least one of the first electrode and the second electrode is disposed in a same layer as at least a part of the electrode connection lines.

13. The display panel according to claim 12, wherein the first electrode and the second electrode are disposed in different layers.

14. The display panel according to claim 5, wherein within the first display sub-pixel, the first electrode is located at one side of the second electrode in the first direction; and
within the first reserved pixel bit, the third electrode is located at one side of the fourth electrode in the first direction.

15. The display panel according to claim 14, wherein within the first display sub-pixel, the first electrode is located at the side of the second electrode away from the driving chip; and
within the first reserved pixel bit, the third electrode is located at the side of the fourth electrode away from the driving chip.

16. The display panel according to claim 5, wherein within the first display sub-pixel, the first electrode and the second electrode are spaced and disposed oppositely in the second direction; and
within the first reserved pixel bit, the third electrode and the fourth electrode are spaced and disposed oppositely in the second direction.

17. The display panel according to claim 16, wherein with a same first display sub-pixel and a same first reserved pixel bit, location of the first electrode with respect to the second electrode is the same as location of the third electrode with respect to the fourth electrode in the second direction.

18. A splicing display device, comprising:
a first sub-screen and a second sub-screen that are spliced with each other along a first direction, wherein each of the first sub-screen and the second sub-screen includes a display panel, comprising:
a display area, and
a non-display area surrounding periphery of the display area, and
the display panel comprises:
a driving chip located in the non-display area at one side of the display area in the first direction; and
a pixel structure comprising a plurality of first repeating units which are located in the display area, the first repeating unit comprising a first display pixel group and a first reserved pixel group which are disposed side by side along the first direction, wherein the first display pixel group comprises a plurality of first display sub-pixels disposed along a second direction, the first reserved pixel group comprises a plurality of first reserved pixel bits disposed along the second direction, the first direction intersects with the second direction, and the first display pixel group and the first reserved pixel group are configured not to emit light simultaneously;
wherein within the first repeating unit, an ordering of emissive colors of the plurality of first display sub-pixels along the second direction is in reverse to a preset ordering of emissive colors of the plurality of first reserved pixel bits along the second direction; and wherein within the first sub-screen, the driving chip is located at one side of the pixel structure away from the second sub-screen;

within the second sub-screen, the driving chip is located at one side of the pixel structure away from the first sub-screen; and wherein within the first repeating unit of one of the first sub-screen and the second sub-screen, the first display pixel group is located at one side of the first reserved pixel group away from the driving chip, and within the first repeating unit of the other of the first sub-screen and the second sub-screen, the first display pixel group is located at one side of the first reserved pixel group near the driving chip.

19. A method for preparing a splicing display device, comprising:

providing a plurality of array substrates, the array substrate comprising a driving chip and an electrode arrangement structure which are spaced in a first direction, wherein the electrode arrangement structure comprises a plurality of electrode repeating units, and the electrode repeating unit comprises a first electrode group and a second electrode group which are disposed side by side in the first direction, wherein the first electrode group comprises a plurality of first electrode units which are disposed side by side along a second direction, and the second electrode group comprises a plurality of second electrode units which are disposed side by side along the second direction and electrically connected with the first electrode units, the first direction intersects with the second direction;

transferring light-emitting chips of multiple colors to one of the array substrates and electrically connecting the light-emitting chips with the first electrode units to form a first sub-screen;

transferring light-emitting chips of multiple colors to another one of the array substrates and electrically connecting the light-emitting chips with the second electrode units to form a second sub-screen, wherein an ordering of emissive colors of the light-emitting chips along the second direction in the first sub-screen is in reverse to an ordering of emissive colors of the light-emitting chips along the second direction in the second sub-screen; and splicing the first sub-screen and the second sub-screen along the first direction, wherein within the first sub-screen, the driving chip is located at one side of the electrode arrangement structure away from the second sub-screen, and within the second sub-screen, the driving chip is located at one side of the electrode arrangement structure away from the first sub-screen.

20. The method according to claim 19, wherein the providing the plurality of array substrates comprises:

forming first electrode groups and second electrode groups at one side of each of the array substrates, wherein the number of the first electrode groups is the same as the number of the second electrode groups;

electrically connecting first electrode units with corresponding second electrode units, wherein within a same electrode repeating unit, an ordering of the plurality of first electrode units is in reverse to an ordering of the corresponding second electrode units.

* * * * *